United States Patent
Vinciarelli et al.

[11] Patent Number: 6,119,923
[45] Date of Patent: Sep. 19, 2000

[54] PACKAGING ELECTRICAL CIRCUITS

[75] Inventors: Patrizio Vinciarelli, Boston, Mass.;
Robert E. Belland, Nashua, N.H.;
George J. Ead, Methuen, Mass.; Fred M. Finnemore, Jefferson, Me.; Lance L. Andrus, Southboro, Mass.

[73] Assignee: VLT Corporation, San Antonio, Tex.

[21] Appl. No.: 09/089,770

[22] Filed: Jun. 3, 1998

Related U.S. Application Data

[60] Division of application No. 08/523,873, Sep. 5, 1995, Pat. No. 5,906,310, which is a continuation-in-part of application No. 08/337,269, Nov. 10, 1994, abandoned.

[51] Int. Cl.[7] ................................................. B23K 31/00
[52] U.S. Cl. .................. 228/179.1; 228/178; 228/123.1; 228/175; 228/215
[58] Field of Search ............................... 228/179.1, 178, 228/123.1, 175, 215

[56] References Cited

U.S. PATENT DOCUMENTS

| | | | |
|---|---|---|---|
| 3,071,854 | 1/1963 | Pighini | 29/473.1 |
| 3,429,040 | 2/1969 | Miller | 29/626 |
| 3,621,338 | 11/1971 | Rogers et al. | 317/101 |
| 3,683,241 | 8/1972 | Duncan | 317/234 |
| 3,737,729 | 6/1973 | Carney | 317/101 |

(List continued on next page.)

FOREIGN PATENT DOCUMENTS

| | | | |
|---|---|---|---|
| 0 141 582 | 5/1985 | European Pat. Off. | G01J 5/34 |
| 0 264 122 A2 | 4/1988 | European Pat. Off. | H01L 21/60 |
| 0 577 484 A1 | 1/1994 | European Pat. Off. | . |

(List continued on next page.)

OTHER PUBLICATIONS

Tummala et al., Microelectronics Packaging Handbook, Van Nostrand Pub. 1989, pp. 212–214.
Sevgin Oktay et al., "High Heat From A Small Package," Mechanical Engineering, Mar. 1986, pp. 36–42.
John R. Saxelby, Jr., et al., "Direct Metal Bonding", U.S. Serial No. 08/336,994, filed Nov. 10, 1994.
Gates and Yokoro, "Sealed Chip–On board Circuit Protection:", 3rd International SAMPE Electronics Conference, Jun. 20–22, 1989, pp. 929–938.

*Primary Examiner*—Patrick Ryan
*Assistant Examiner*—M. Alexandra Elve
*Attorney, Agent, or Firm*—Fish & Richardson P.C.

[57] ABSTRACT

A method for soldering a first component having a metal surface to a second component having a metal surface includes holding the metal surface of the first component in a position above a placement area on the metal surface of the second component to establish a gap between the surfaces. The method further includes reflowing solder within the gap.

A structure including a thermally conductive baseplate, an electrical insulator attached to the baseplate, and a metallic shield mounted on the insulator. The structure also includes an integrated power device having a power-dissipating electronic device, and a first metal layer connected to the shield through a solder joint. A substrate includes an aperture, and the integrated power device is mounted with the power-dissipating device sitting within the aperture. The substrate also includes a conductive run electrically connected to a second metal layer of the integrated power device.

A method for use in making a package for electrical circuits includes attaching an electrical insulator within a recess of a first metallic component. The method also includes registering a second metallic component within the recess using a template tool and bonding the second metallic component to the insulator. A third component is soldered to the second metallic component.

A structure including an electrical conductor and a sheet of conductive material including a punt soldered to the electrical conductor

12 Claims, 17 Drawing Sheets

U.S. PATENT DOCUMENTS

| | | | |
|---|---|---|---|
| 4,218,724 | 8/1980 | Kaufman | 361/395 |
| 4,278,990 | 7/1981 | Fichot | 357/81 |
| 4,315,175 | 2/1982 | Hamilton et al. . | |
| 4,400,762 | 8/1983 | Bartley et al. | 361/402 |
| 4,417,296 | 11/1983 | Schelhorn | 361/386 |
| 4,531,145 | 7/1985 | Wiech, Jr. | 357/81 |
| 4,551,746 | 11/1985 | Gilbert et al. | 357/74 |
| 4,551,747 | 11/1985 | Gilbert et al. | 357/74 |
| 4,649,461 | 3/1987 | Matsuta . | |
| 4,650,107 | 3/1987 | Keser | 228/123 |
| 4,724,283 | 2/1988 | Shimada et al. | 174/68.5 |
| 4,740,414 | 4/1988 | Shaheen | 428/210 |
| 4,750,089 | 6/1988 | Derryberry et al. | 361/388 |
| 4,769,525 | 9/1988 | Leatham | 219/209 |
| 4,783,695 | 11/1988 | Eichelberger et al. | 357/65 |
| 4,783,697 | 11/1988 | Benenati et al. | 357/80 |
| 4,793,543 | 12/1988 | Gainey et al. | 228/121 |
| 4,823,235 | 4/1989 | Suzuki et al. . | |
| 4,847,136 | 7/1989 | Lo | 428/195 |
| 4,872,081 | 10/1989 | Murphy et al. | 361/117 |
| 4,879,630 | 11/1989 | Boucard et al. | 361/386 |
| 4,918,811 | 4/1990 | Eichelberger et al. | 29/840 |
| 4,953,005 | 8/1990 | Carlson et al. | 357/80 |
| 4,985,097 | 1/1991 | Matsumura et al. | 156/87 |
| 4,990,490 | 2/1991 | Pathare et al. . | |
| 4,994,215 | 2/1991 | Wiech, Jr. | 264/27 |
| 4,996,116 | 2/1991 | Webster et al. | 428/627 |
| 5,006,673 | 4/1991 | Freyman et al. | 174/255 |
| 5,019,941 | 5/1991 | Craft | 361/386 |
| 5,019,946 | 5/1991 | Eichelberger et al. | 361/414 |
| 5,028,987 | 7/1991 | Neugebauer et al. | 357/80 |
| 5,176,309 | 1/1993 | Horiguchi et al. | 228/122 |
| 5,216,279 | 6/1993 | Nakao | 257/712 |
| 5,271,548 | 12/1993 | Maiwald | 228/175 |
| 5,280,850 | 1/1994 | Horiguchi et al. | 228/122.1 |
| 5,296,735 | 3/1994 | Fukunaga | 257/659 |
| 5,324,890 | 6/1994 | Lawlyes | 174/52.4 |
| 5,328,751 | 7/1994 | Komorita et al. | 428/209 |
| 5,365,403 | 11/1994 | Vinciarelli et al. | 361/707 |
| 5,372,295 | 12/1994 | Abe et al. | 228/123.1 |
| 5,447,267 | 9/1995 | Sakai et al. | 228/175 |
| 5,911,356 | 6/1999 | Tsurusaki . | |
| 5,929,510 | 7/1999 | Geller et al. | 257/635 |

FOREIGN PATENT DOCUMENTS

| | | | |
|---|---|---|---|
| 1 127 179 | 4/1962 | Germany . | |
| 50-103452 | 8/1975 | Japan . | |
| 51-9459 | 3/1976 | Japan . | |
| 52-11769 | 1/1977 | Japan . | |
| 54-8462 | 1/1979 | Japan . | |
| 57-53948 | 3/1982 | Japan . | |
| 57-190768 | 11/1982 | Japan . | |
| 60-260192 | 12/1985 | Japan . | |
| 61-156791 | 7/1986 | Japan . | |
| 61-177762 | 8/1986 | Japan . | |
| 63-119242 | 5/1988 | Japan . | |
| 63-114095 | 7/1988 | Japan . | |
| 63-273398 | 11/1988 | Japan | H05K 3/34 |
| 1-161892 | 6/1989 | Japan . | |
| 2-192792 | 7/1990 | Japan . | |
| 4-346260 | 12/1992 | Japan . | |
| 05129515 | 5/1993 | Japan . | |
| 5-347475 | 12/1993 | Japan | H05K 3/34 |
| 6-23534 | 2/1994 | Japan . | |
| 6-48851 | 2/1994 | Japan . | |
| 6-90083 | 3/1994 | Japan . | |
| 7-202475 | 8/1995 | Japan . | |
| 7-254781 | 10/1995 | Japan . | |

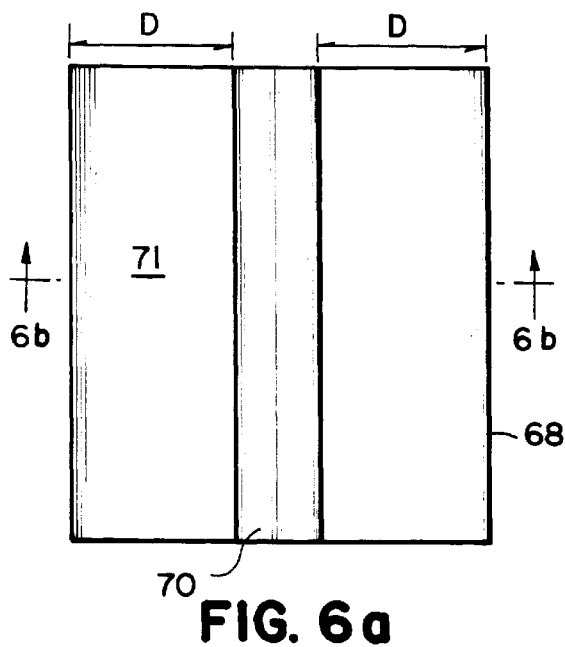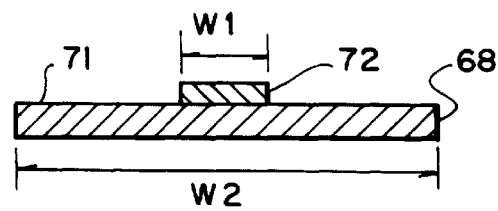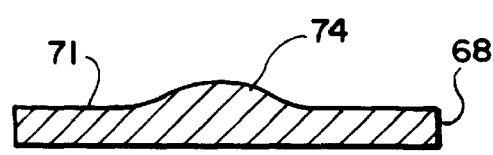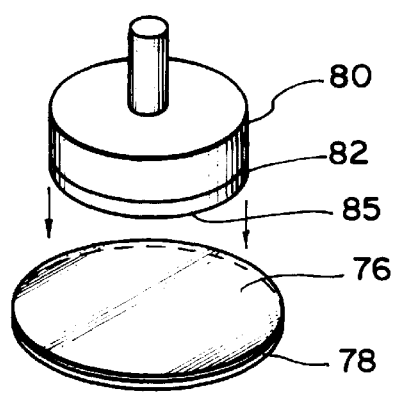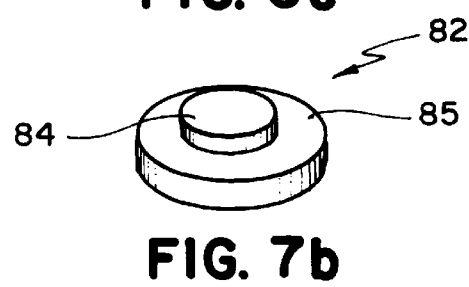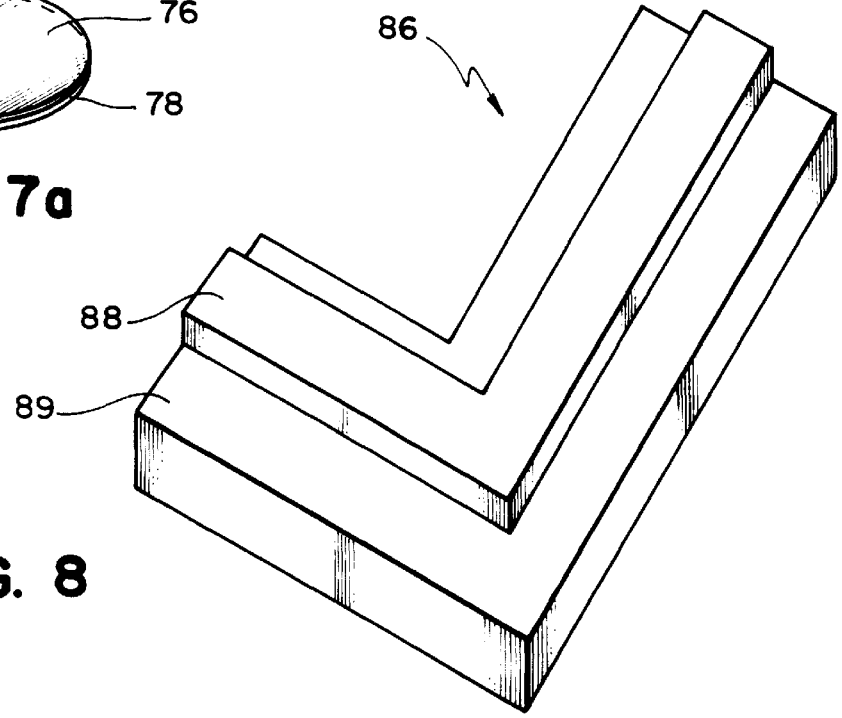

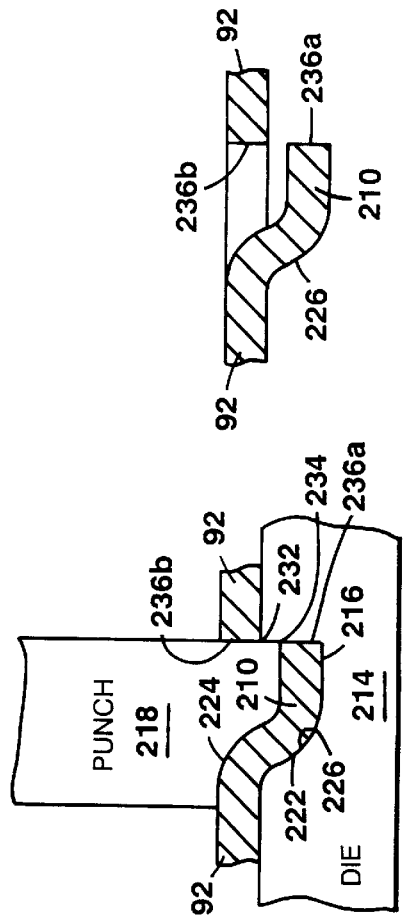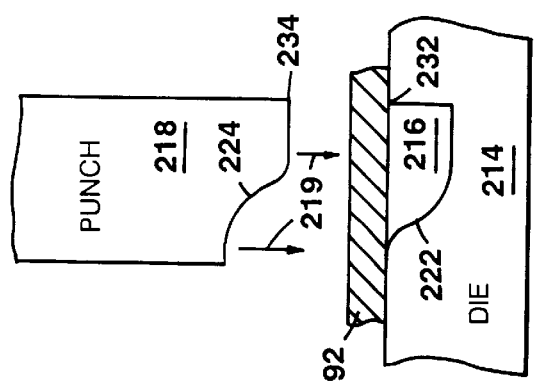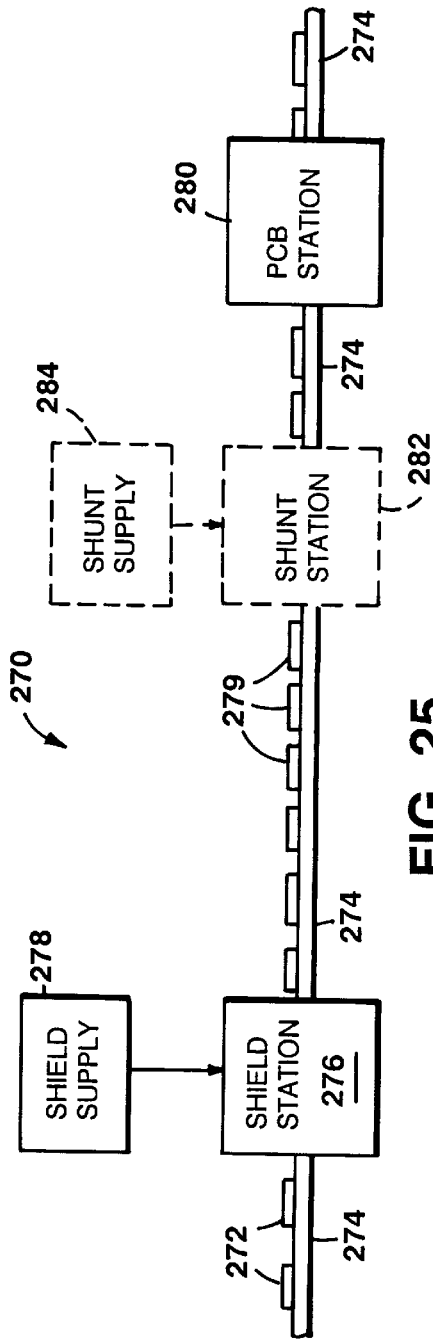
FIG. 20e
FIG. 25

PACKAGING ELECTRICAL CIRCUITS

CROSS REFERENCE TO RELATED APPLICATIONS

This application is a divisional of prior U.S. application Ser. No. 08/523,873, filed Sep. 5, 1995, U.S. Pat. No. 5,906,310 May 25, 1999 which is a continuation-in-part of prior U.S. application Ser. No. 08/337,269, filed Nov. 10, 1994 abandoned.

BACKGROUND

This invention relates to packaging of electrical circuits.

In certain packaging applications, e.g., within a modular DC—DC converter, heat from power dissipating components must be efficiently conducted to a metal outer surface of an enclosure (e.g., a baseplate). The metal outer surface must also be electrically insulated from the power dissipating components.

One way of packaging a power device, described in U.S. patent application Ser. No. 07/914,347, filed Nov. 23, 1993, assigned to the same assignee as this application and incorporated by reference, is illustrated in FIG. 1a. In FIG. 1a, a semiconductor die 10 is connected, (e.g., with solder (not shown)), to a conductive copper lead 14. Copper lead 14 may serve as an electrical connection to the die and may also serve as a heat spreading layer that helps in removing heat from die 10. Copper lead 14 is directly bonded through a eutectic or oxide bond 16 to a ceramic layer 18. An adhesive 20 (e.g., epoxy) holds ceramic layer 18 to an aluminum baseplate 22. This arrangement aids in conducting heat H, from semiconductor die 10, to baseplate 22. Ceramic layer 18 electrically insulates conductive copper lead 14 from conductive baseplate 22.

Another way of achieving both electrical insulation and thermal coupling between circuit components and a metal surface is by means of a Denka plate. A Denka plate is a composite laminate comprising alternating layers of thin metallic conductors (e.g., copper) and epoxy which is deposited on a relatively thicker metal plate. The epoxy layers provide insulation between the conductive layers and the metal plate.

It is well known to reduce the capacitance between a component and a metal baseplate by interposing a properly referenced electrostatic shield between the component and the baseplate. For example, FIG. 1b shows one way of providing a shield between a TO-220 power semiconductor package 200 and a metal baseplate 22. In FIG. 1b, the metal tab 250 of a TO-220 package is mounted to the top surface of a sandwich formed of two pieces of ceramic 218a, 218b and a metallic shield 230. The bottom surface of the sandwich is mounted (e.g., by epoxy layer 220) to a baseplate 22. Assume, for example, that a high frequency signal is present on the tab 250 and that the lead 240 and the baseplate 22 are at ground potential. If, as indicated in FIG. 1c, the lead 240 and the shield 230 are connected together (either directly, as shown, or via a capacitor, not shown), the current, In, which is capacitively coupled into the shield 230 via the tab-to-shield capacitance 260, Cps, will be returned to the grounded source lead 240 via the shield 230; little or no current will be coupled into the baseplate 22. On the other hand, if the shield is not present, or is not connected, current will be capacitively injected directly into the baseplate. In the latter case substantially greater EMI/RFI reduction measures might have to be taken to control conducted noise.

SUMMARY OF THE INVENTION

In general, in one aspect, the invention features a method for soldering a first component having a metal surface to a second component having a metal surface includes holding the metal surface of the first component in a position above a placement area on the metal surface of the second component to establish a gap between the surfaces. The method further includes reflowing solder within the gap.

Implementations of the invention may include the following features. Solder is applied in the vicinity of the placement area. Applying solder includes dispensing solder paste along a perimeter of the placement area or placing a solder preform on the placement area. To reflow the solder, the metal surface of the second component can be heated. Flux may be dispensed within the placement area. A solder mask may be applied to the metal surface of the second component to form a corral which surrounds the placement area. The first component may be an integrated power device. The second component may be a metallic plate. The method may also include applying an adhesive pattern between the first component and the second component, and curing the adhesive pattern. The adhesive pattern may be epoxy dots. The adhesive pattern may be applied along a perimeter of the placement area. Holding may include dispensing an adhesive pattern on the metal surface of the second component in the vicinity of the placement area, pressing the first component onto the adhesive pattern, and releasing the first component to allow a portion of the adhesive pattern remaining between the first component and the second component to rebound and establish the gap. The first component may also be pressed onto a solder preform that establishes the gap. Pressing the first component onto the adhesive pattern registers the first component with respect to the second component. Pressing the first component onto the adhesive pattern may press a portion of the metal surface of the first component onto the adhesive pattern. The metal surface of the first component may be copper.

In general, in another aspect, the invention features a structure including a thermally conductive baseplate, an electrical insulator attached to the baseplate, and a metallic shield mounted on the insulator. The structure also includes an integrated power device having a power-dissipating electronic device, and a first metal layer connected to the shield through a solder joint. A substrate includes an aperture, and the integrated power device is mounted with the power-dissipating device sitting within the aperture. The substrate also includes a conductive run electrically connected to a second metal layer of the integrated power device.

Implementations of the invention may includes the following features. The insulator of the structure may introduce compliance between the baseplate and the shield allowing lateral movement of the baseplate with respect to the shield as the structure is exposed to varying temperatures. This reduces the tensile stress on a ceramic layer of the integrated power device. The stiffness of the shield reduces the bending of the ceramic layer of the integrated power device as the structure is exposed to varying temperatures. The structure may also include a conductive shunt soldered between the shield and a conductive run of the substrate, or a conductive punt may be formed in the shield and soldered to a conductive run of the substrate. The shield may have segments, including an input shield segment and an output shield segment. The shield may be formed by laminating layers of conductive materials, including aluminum, copper, and silver. The insulator may be an insulating film or layers of film material, including Kapton MT. The insulator may be a thermally loaded polyimide film, and it may have an adhesive dispersed over a surface.

In general, in another aspect, the invention features a method for use in making a package for electrical circuits includes attaching an electrical insulator within a recess of a first metallic component. The method also includes registering a second metallic component within the recess using a template tool and bonding the second metallic component to the insulator. A third component is soldered to the second metallic component.

Implementations of the invention may include the following features. The first metallic component may be a baseplate. The second metallic component may be a shield. The third component may be an integrated power device. The insulator may include layers of film material, and the layers may have an adhesive dispersed over a surface. The film material may be Kapton MT. Attaching the insulator within the recess may include applying a pressure profile against the insulator within the recess over time to allow trapped air and released gas to escape, and applying a second pressure profile against the insulator within the recess over time to attach the insulator within the recess of the first metallic component. The pressure may be applied through a press tool, and the press tool may include a surface having a ridged portion. The ridged portion may follow the surface of the pad and the contours of the shape of the surface of the pad. Heating the first metallic component can cause an adhesive coating on a bottom one of the film layers, adjacent to the recess, to attach to the recess. The pad may be teflon which does not attach to an adhesive coating on a top one of the film layers, adjacent to the teflon pad, at the predetermined temperature. Registering may include inserting the second metallic component within a recess of the template tool, wherein the second metallic component extends above a surface of the template tool surrounding the recess of the template tool, and placing the first metallic component on the template tool to fit the template tool snugly within the recess of the first metallic component to register the second metallic component within the recess of the first metallic component. Bonding may include inserting the first metallic component and the template tool into a press, heating the first metallic component to a predetermined temperature, resting a press tool on the template tool for a first predetermined time to allow trapped air and released gas to escape, and pressing the press tool on the template tool at a predetermined pressure for a second predetermined amount of time to bond the second metallic component to the insulator. The second metallic component may include segments, including an input segment and an output segment, and the template tool may include recesses for the segments. Soldering may include soldering a top surface of a punt formed in the second metallic component to the third component.

In general, in another aspect, the invention features a method of manufacturing packages for electrical circuits moving along an automated production line which includes providing a supply of conductive shunts at a station along the production line. For each of the packages that approach the station on the production line, the shunts required to be soldered between a shield and a substrate of the package are determined, and the required shunts are soldered to the shield.

Implementations of the invention may include the following features. The conductive shunts may be identical. The shield may include segments, including an input shield and an output shield segment, and determining may include determining the shunts required to be soldered between the input shield segment and the substrate and between the output shield segment and the substrate.

In general, in another aspect, the invention features a method of manufacturing packages for electrical circuits moving along an automated production line which includes providing a supply of metallic shields at a station along the production line, where the shields include different numbers of punts. For each of the packages that approach the station on the production line, the punts required to be soldered to a substrate of the package are determined, a shield with the determined number of punts is selected, and the punts of the selected shield are soldered to the substrate.

Implementations of the invention may include the following features. The conductive punts may be identical, and the shield may include segments.

In general, in another aspect, the invention features a method of manufacturing packages for electrical circuits moving along an automated production line which includes providing a supply of metallic shields at a station along the production line. For each of the packages that approach the station on the production line, the method includes determining the punts required to be soldered to a substrate of the package, punching a shield with the determined number of punts, and soldering the punts of the punched shield to the substrate.

Implementations of the invention may include the following features. The conductive punts may be identical, and the shield may include segments.

Implementations of the invention may include the following features. The electrical conductor may be a conductive run on a printed circuit board, and the sheet may include multiple layers of conductive materials bonded together. The punt may have a fully-rounded configuration or a louvered configuration.

Advantages of the invention include the following. The insulator of the structure introduces compliance between the baseplate and the shield allowing lateral movement of the baseplate with respect to the shield as the structure is exposed to varying temperatures which reduces the tensile stress on the ceramic layer of the integrated power device. The stiffness of the shield reduces bending of the ceramic layer of the integrated power device as the structure is exposed to varying temperatures. The adhesive pattern maintains the precise registration of the integrated power device on the shield until the integrated power device can be soldered to the shield. Using the template tool reduces the cost of and time required for manufacturing by allowing the shield to be registered and bonded within the baseplate recess in one step. The template tool also provides for precise registration of the shield within the recess. Using a press tool with a pad having a ridged portion on the surface which is pressed against the insulator increases the amount of trapped air and released gas that escapes from between layers of the insulator and from between the insulator and the recess.

Shunts and punts permit the shield to pass current between points on a PCB or between a point on a PCB and an output pin. Using a punt instead of a shunt reduces inventory and eliminates the process step of placing and soldering the shunt. Using louver punts instead of fully-rounded punts reduces the amount of shield real estate required and prevents edges of the shield from rippling when the punt is formed.

A variety of other advantages and features will become apparent from the following description and from the claims.

DETAILED DESCRIPTION

We first describe the drawings:

FIG. 4b is an enlarged perspective cutaway view of a portion of the structure of FIG. 4a.

FIG. 6a is a bottom view of a pad.

FIGS. 6b and 6c are sectional side views of pads.

FIG. 7a is a perspective view of an assembly process.

FIGS. 7b and 8 are perspective bottom views of pads.

FIG. 20e is a series of side cross-sectional views of a method of forming a punt.

FIG. 25 is a block diagram of an automated production line.

The thermal expansion coefficient of aluminum (Al) is about $25 \times 10^{-6}$ inches per inch per degree C. The thermal expansion coefficient of ceramic (aluminum oxide, $Al_2O_3$), however, is only about $8 \times 10^{-6}$ inches per inch per degree C. As the thickness of the baseplate 22 in the construction of FIG. 1a increases, mechanical stress, inflicted on ceramic layer 18 by baseplate 22 due to the thermal expansion coefficient mismatch, increases and can cause cracks or conoidal fractures 24 in ceramic layer 18. Even where the ratio of the thicknesses of the baseplate and ceramic is arranged so that cracks and fractures will not occur in the ceramic layer 18, there is still the danger that thermal expansion and contraction may compromise, or cause failure of, the mechanical (and hence the thermal) integrity of the adhesive layer 20.

Figure 2:
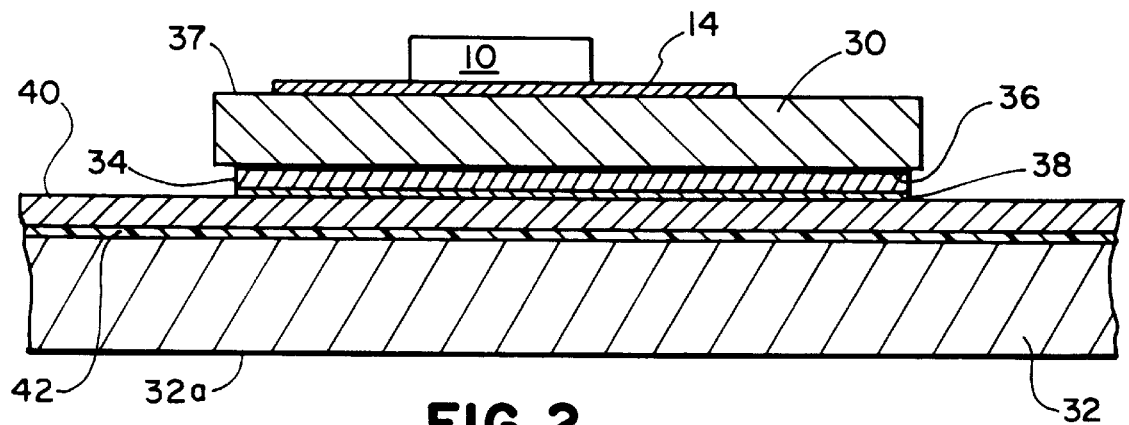
FIG. 2 is a cross-sectional side view of another electrical circuit packaging scheme.

Referring to FIG. 2, both the ability to withstand the effects of thermal expansion, and the thermal resistance between the die and the baseplate 32, may be improved by appropriate mechanical decoupling of the ceramic layer 30 from the baseplate 32. A copper layer 34 is directly bonded through eutectic bond 36 to a bottom side of ceramic layer 30. A semiconductor die 10 and a copper lead 14 are mounted on top of ceramic layer 30. A bottom face of copper layer 34 is attached by solder 38 to a metal shield plate 40. Shield plate 40 and baseplate 32 are separated by an electrical insulator 42. Since the shield 40 is interposed between, and insulated from, both the die 10 and the baseplate 32, it may be connected as an electrostatic shield (by means discussed below) to reduce the capacitance between the die 10 and the baseplate 32.

Figure 1A:
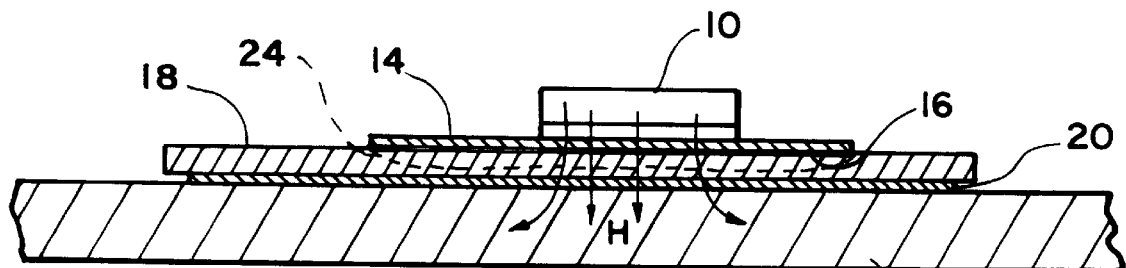
FIG. 1a is a cross-sectional side view of an electrical circuit packaging scheme.

Failure of the ceramic 18 in the assembly of FIG. 1a occurs when bending of the ceramic induces tensile stresses in excess of the maximum allowable value. This maximum allowable tensile stress is typically much lower than the maximum allowable compressive stress for a ceramic subject to brittle failure. The bending is caused by the differences in the coefficient of thermal expansion of the aluminum 22 and ceramic 18 and temperature excursions of the assembly during manufacturing and operation. The ability of the assembly of FIG. 2 to withstand temperature induced stress is due to a combination of factors, including the fact that the lower modulus of elasticity of the insulating layer 42 introduces compliance between the baseplate 32 and the shield 40 which allows lateral movement of the metals relative to each other. The compliance thereby reduces the amount of bending of the ceramic 30 with a subsequent reduction in the maximum tensile stress in the ceramic. Also, increasing the modulus of elasticity of the composite metallic layers (by utilizing the copper layer 34 having a higher modulus of elasticity than the aluminum baseplate 32) increases the stiffness of the overall metal laminate with respect to the ceramic 30, resulting in reduced bending of the ceramic.

Additionally, thermal resistance between ceramic layer 30 and baseplate 32 is improved relative to the construction of FIG. 1a. In FIG. 1a, all heat, H, must pass from the lower surface of the ceramic 18 into the baseplate through the area of the adhesive bond 20. Adhesives suitable for this application, such as epoxies, are typically relatively poor thermal conductors. In FIG. 2, the heat passes through high thermal conductivity metallic layers 34, 38 and is then spread over a relatively large area by the highly thermally conductive metal shield 40. The heat then passes down through insulator 42 into the baseplate. Ordinarily, an insulator 42 such as Kapton MT polyimide sheet would, like an epoxy bond, also have a relatively poor thermal conductivity. However, since the area of the insulator 42 (FIG. 2) through which the heat passes may be made very much larger than the area of the adhesive bond 20 (FIG. 1a), the construction of FIG. 2 will typically exhibit better thermal conductivity between the lower surface of the ceramic and the metal baseplate.

Figure 3:
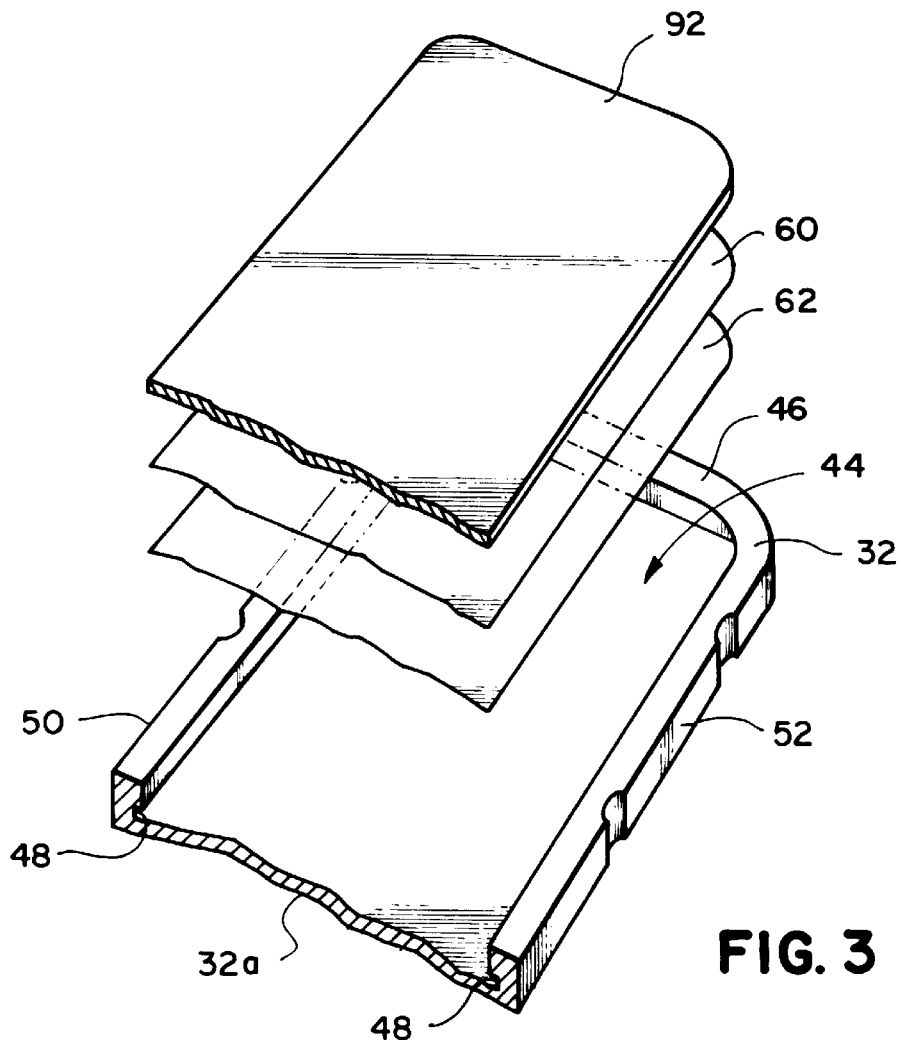
FIG. 3 is an exploded perspective cutaway view of insulating film layers and a baseplate.
Figure 4A:
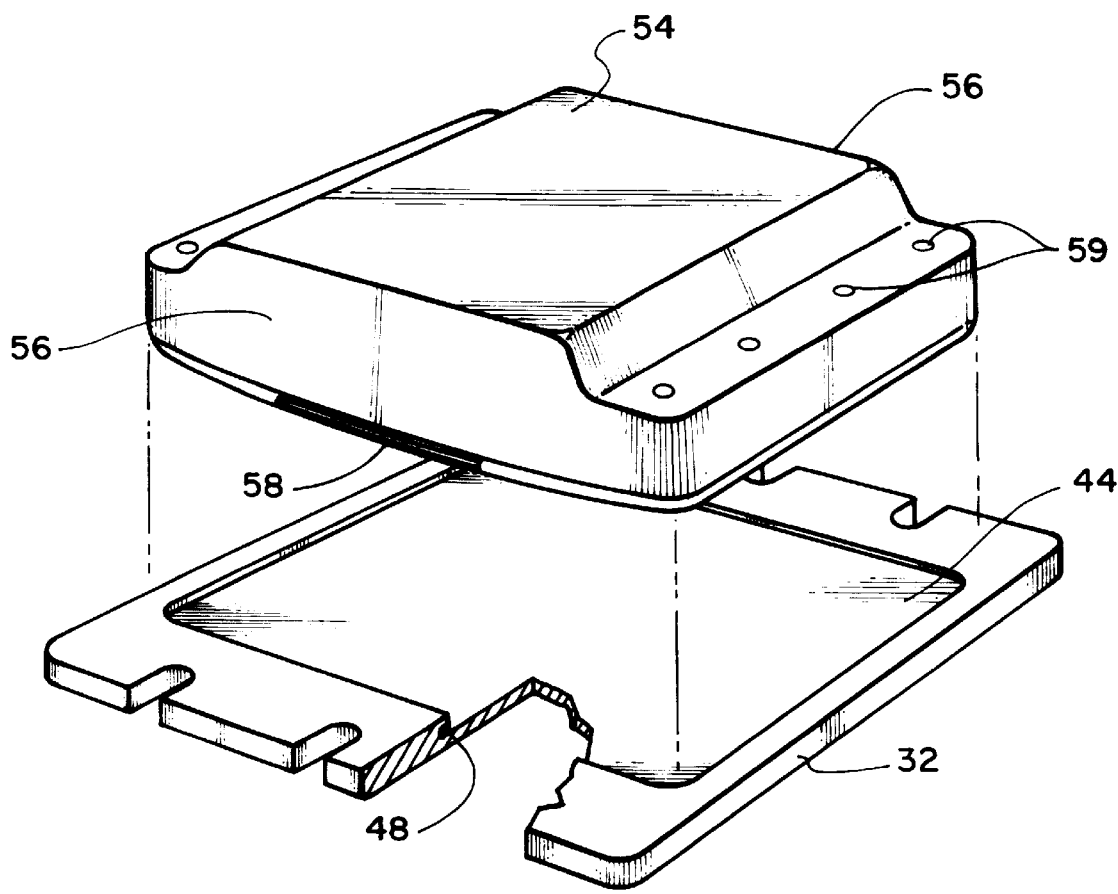
FIG. 4a is an exploded perspective cutaway view of a case and a baseplate.
Figure 4B:
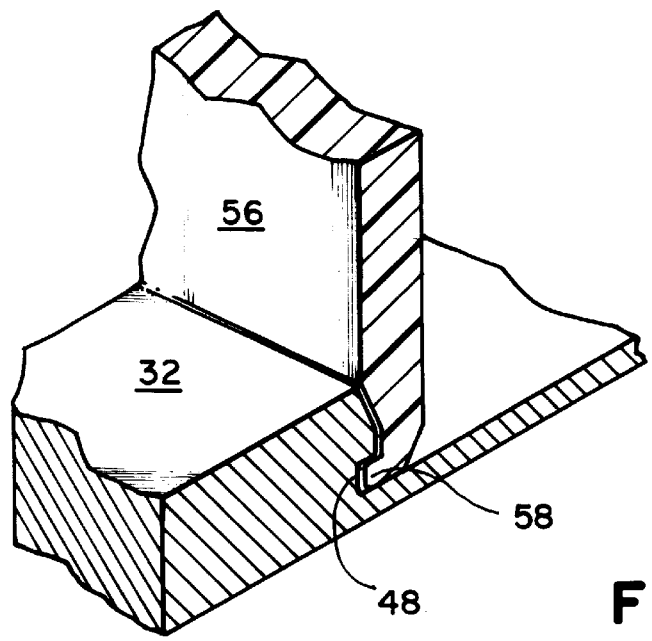

Referring to FIG. 3, baseplate 32, made of 6063 aluminum alloy, may include a recess 44, a ridge 46 around the perimeter of the recess 44, and an undercut 48 along sides 50 and 52. Aluminum works well as the baseplate 32 material because it has good thermal conductivity and is easy to manufacture and machine, but other thermally conductive materials could be used. Referring also to FIGS. 4a and 4b, recess 44 and undercut 48 allow a generally cup-shaped case 54 of molded thermoplastic material (e.g., Valox or Ultem), having side walls 56 with teeth 58, formed to fit into undercut 48, to be connected to baseplate 32. Case 54 and baseplate 32 enclose electrical components (not shown), including semiconductor dies electrically connected through copper leads, mounted on ceramic layers (i.e., ceramic layer 30, FIG. 2), to a printed circuit board (PCB, not shown) to form an electrical device. The device may be a power converter. External connections to the enclosed PCB can be made through leads (not shown) extending through holes 59 in case 54. For more information regarding the case and the assembly of the case and baseplate, see U.S. patent application Ser. No. 07/914,347, filed on Nov. 23, 1993, assigned to the same assignee as this application, and incorporated by reference.

Two thin layers of thermally conductive polyimide film 60, 62 (FIG. 3) are placed in recess 44. The two layers are generally identical and can be of the type called Kapton MT, manufactured and sold by Dupont Films, Circleville, Ohio, U.S.A. One layer of polyimide film provides sufficient dielectric strength to electrically insulate aluminum baseplate 32 from a conductive shield plate 92 (FIG. 9) to be mounted on the other side of the film layers. To meet requirements imposed by international safety agencies (e.g., Underwriters Laboratory—U.L.), however, typically requires two layers to protect against shorts caused by pinholes in a single film layer; there is a very low probability that pinholes in both polyimide film layers would line up to form a short. Polyimide film layers 60, 62 are coated on both sides with a polyimide adhesive (e.g., a pure polyimide thermoset, also manufactured by Dupont, dispersed on both sides of the film) for attachment of the film layers to baseplate 32, to each other 60, 62, and to conductive shield plate 92.

Figure 5:
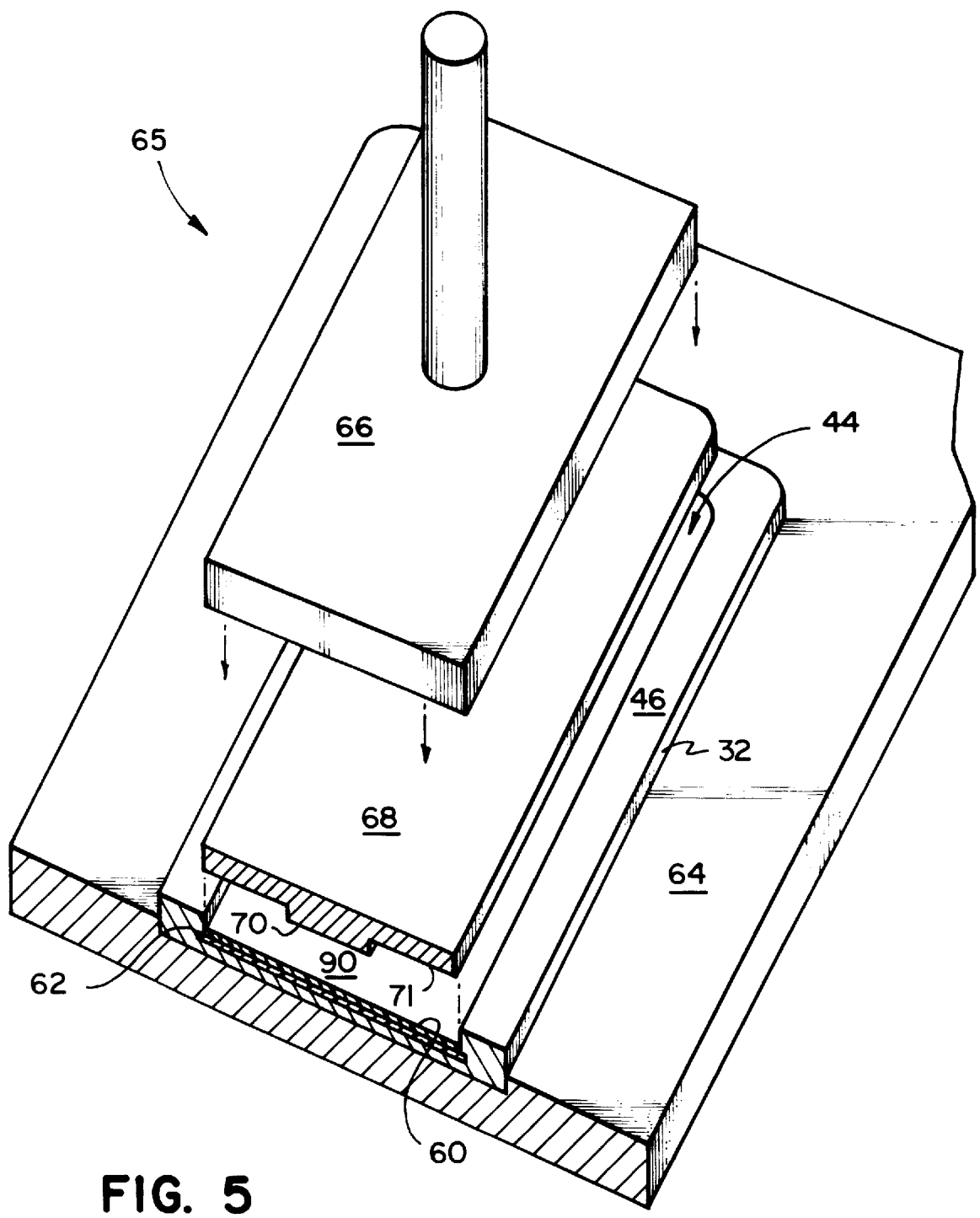
FIG. 5 is an exploded perspective cutaway view showing a bonding process.
Figure 9:
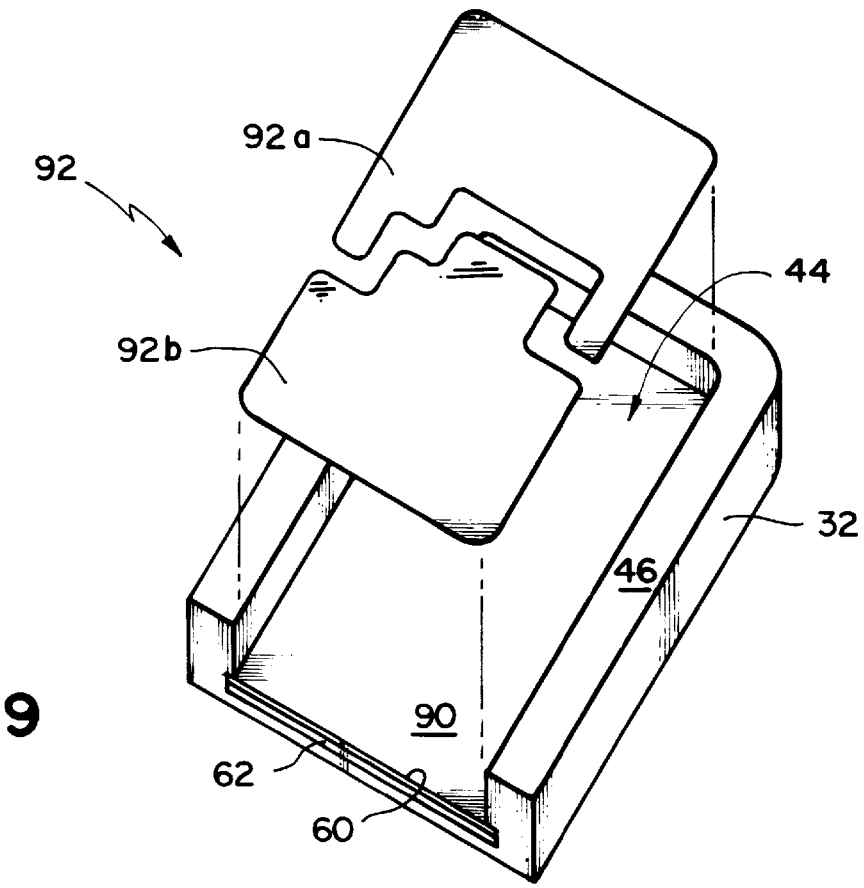
FIG. 9 is an exploded perspective cutaway view of part of a packaging scheme.

Referring to FIG. 5, to attach film layers 60, 62 to baseplate 32 and to each other, baseplate 32 is put on a heat plate 64 of a press 65 that heats baseplate 32 to approximately 190° C. A press tool 66, fitted with a teflon pad 68, is brought down on the film layers 60, 62 in recess 44. The teflon pad neither sticks to nor disturbs the polyimide adhesive on the top of film layer 60, and, as a result, the adhesive can be used later for attachment of a conductive shield plate 92 (FIG. 9).

Initially, only the weight of the press tool, between zero and twenty pounds per square inch (psi) of pressure, is applied to the film layers. This allows air caught between the layers and gases released (e.g., out-gassed) by the adhesive coatings to escape from between film layers 60, 62 and from between bottom film layer 62 and baseplate 32. At 190° C., it takes about thirty seconds for all the gas to be released and escape.

Referring to FIGS. 6a, 6b, 6c, to increase the amount of gas that escapes, the center of a bottom side 71 (FIG. 5) of teflon pad 68 is formed with a ridge 70. The ridge may be formed in many ways, including by attaching another layer of teflon 72 (FIG. 6b), with a smaller width W1 than the width W2 of teflon pad 68, to teflon pad 68 or by molding teflon pad 68 to have an extended portion 74 (FIG. 6c). The ridge shortens the distance D that trapped gas must travel in order to escape, and at zero to twenty psi, ridge 70 produces a "wave effect" that causes trapped gas to move toward the edges of film layers 60, 62 where it can escape.

The film layers can be different shapes and need not be placed within a recess of a baseplate. Teflon pads that correspond to the shapes of the film layers and that have centered ridges which follow the shape of the teflon pad and film layers can again be used to increase the amount of gas that escapes from between the film layers as the film layers are attached. For instance, where the film layers 76, 78 are circular (FIG. 7a), a circular press tool 80 with a circular teflon pad 82 is provided, and, as shown in FIG. 7b, centered on a bottom side 85 of teflon pad 82 is a circular ridge 84. Similarly, where the film layers (not shown) are "L" shaped, an L shaped teflon pad 86 (FIG. 8), is provided with an L shaped ridge 88 centered on a bottom side 89 of teflon pad 86.

After allowing trapped gas to escape, press 65 increases the pressure on the press tool 66 and teflon pad 68 (FIG. 4) to 400 psi. This pressure is applied to film layers 60, 62 and baseplate 32 for approximately ten seconds at 190° C. to attach the film layers to each other (forming insulating layer 42, FIG. 2) and to the baseplate. The press tool is then lifted and the baseplate and bonded film layers are removed from the press and allowed to cool.

A temperature of 190° C. is chosen since it is within the bonding temperature range of the polyimide adhesive, is above the melting point of the polyimide film, but is below the melting point of the Teflon pad.

Figure 10:
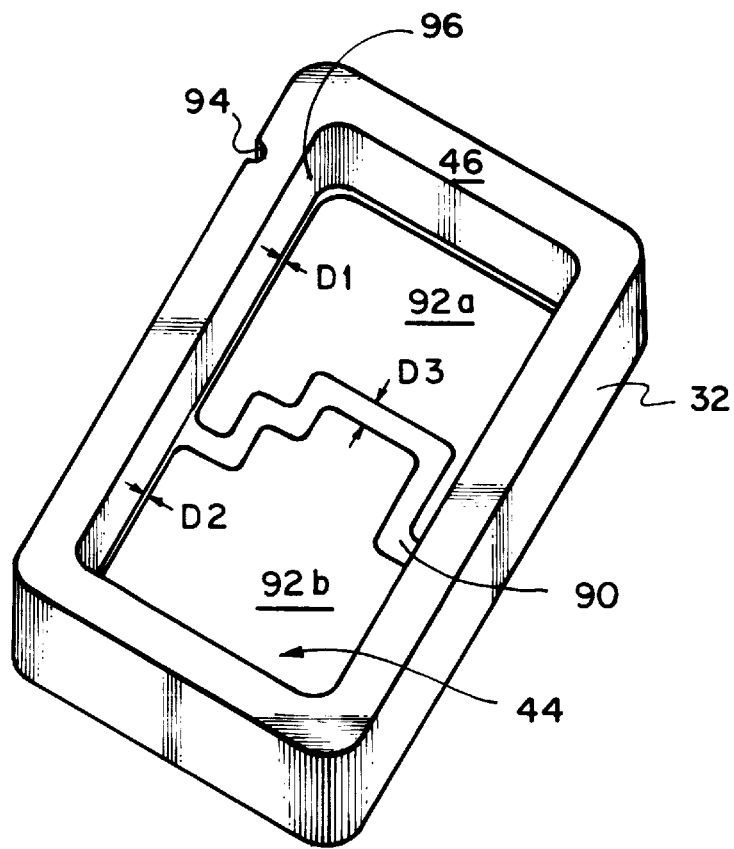
FIG. 10 is a perspective view similar to FIG. 11 and at a later stage in assembly.

Referring to FIGS. 9 and 10, a shield plate 92 is placed in recess 44 on top surface 90 of bonded film layer 60. Shield plate 92 can be a continuous sheet or can have multiple segments, e.g., 92a and 92b. For example, in a power converter, shield 92a (the input shield) might be associated with, and possibly be connected to, electronic circuitry connected to the input (not shown) of the converter, and shield segment 92b (the output shield) might be associated with, and possibly be connected to, electronic circuitry connected to the output (not shown) of the converter. A notch 94 in baseplate 32 can be used as a reference point when manufacturing the device to help in locating the shield(s) within the recess.

In the case of a power converter which is to meet certain safety agency standards the input shield 92a, output shield 92b, and baseplate 32 will need to be insulated from each other. For a power converting device, U.L. safety standards require that the device be able to withstand a voltage differential of up to 3000 volts between input shield 92a and output shield 92b. Similarly, U.L. safety standards require that the device be able to withstand a voltage differential of up to 2000 volts between input shield 92a and an inside edge 96 of baseplate 32 and up to 1000 volts between output shield 92b and inside edge 96 of baseplate 32.

On the one hand, the larger the distances D1 (input shield 92a to edge 96), D2 (output shield 92b to edge 96), and D3 (input shield 92a to output shield 92b), the larger the voltage differentials that can be withstood. On the other hand, it is desirable to make the shields as large as possible and as close as possible to each other and to the edge of the baseplate, so that, for example, they can provide the minimum possible thermal resistance and be able to carry the maximum amount of current.

Figure 11:
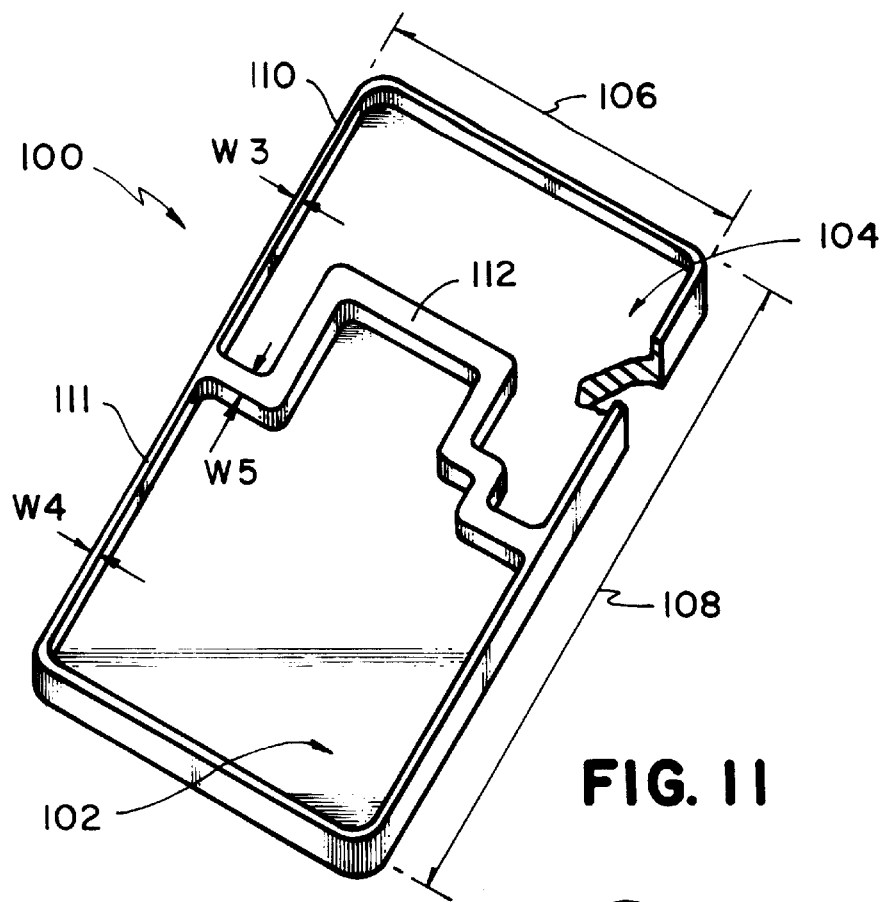
FIGS. 11 and 12 are perspective bottom views (FIG. 12 is cutaway) of a template tool without and with shields placed in recesses of the template tool.

A placement tool 100 (FIG. 11), referred to as a template tool, is used to register (i.e., precisely place) the input and output shields 92a, 92b (FIGS. 9 and 10) within baseplate recess 44. Template tool 100 is manufactured with recesses 102, 104 that match the shapes of the input and output shields 92a, 92b, respectively. Recesses 102, 104 are precisely milled by a computer numerical control (CNC) milling machine using the dimensions of the shields. If the design of the shields changes, a new template tool can be quickly and easily made using the new dimensions of the shields. The outer dimensions 106, 108 of template tool 100 match the dimensions of recess 44 (FIGS. 9 and 10). Width W3 of outer ridge 110 precisely matches the distance D1 that input shield 92*a* needs to be away from inside edge 96 of baseplate ridge 46 (FIG. 10), width W4 of outer ridge 111 precisely matches the distance D2 that output shield 92*b* needs to be away from inside edge 96, and width W5 of inner ridge 112 precisely matches the distance D3 that input and output shields 92*a*, 92*b* need to be away from each other.

Figure 12:
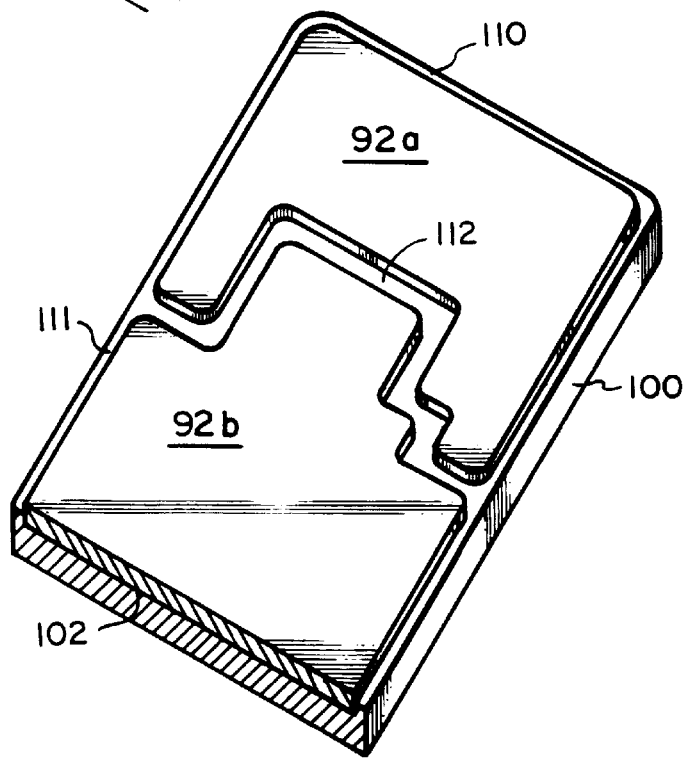
Figure 13:
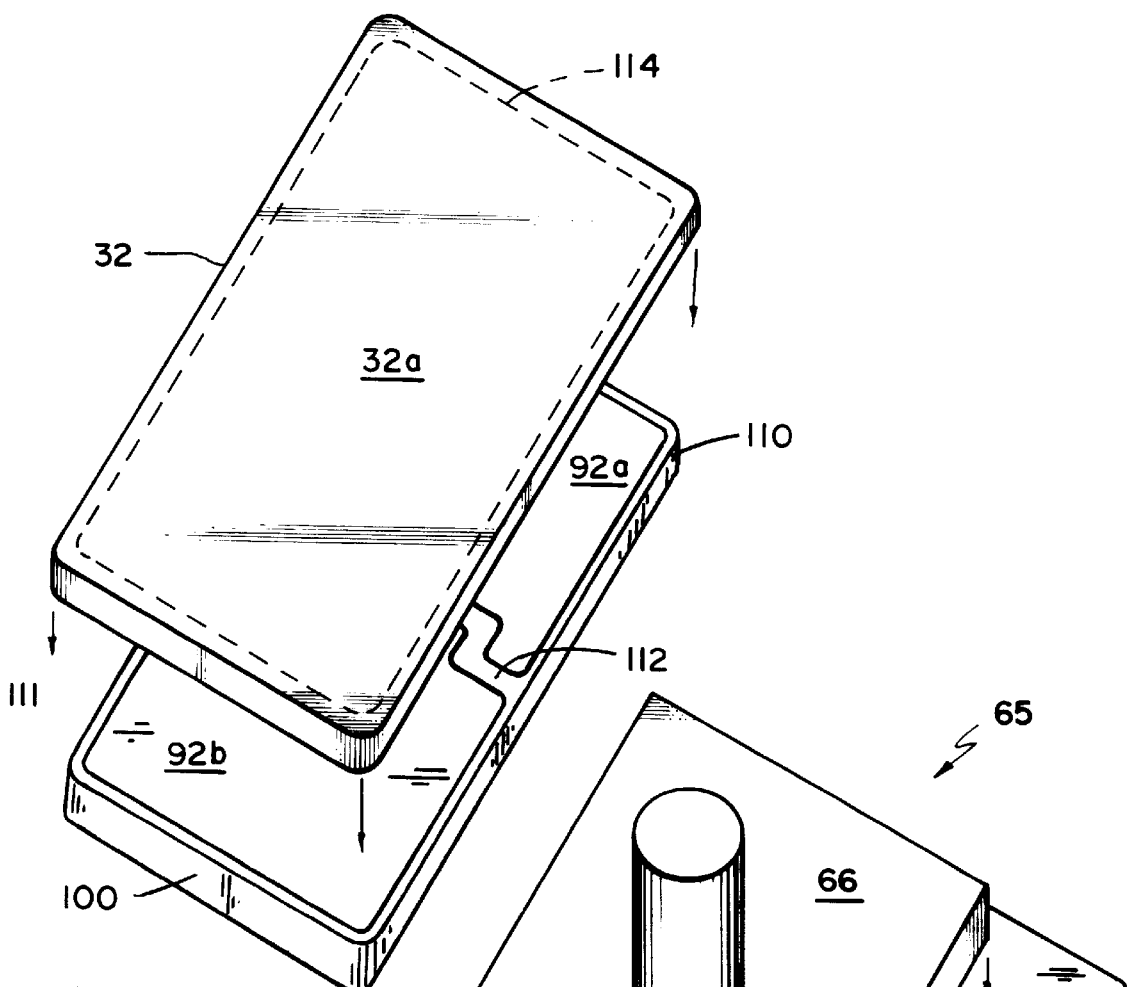
FIG. 13 is an exploded perspective view of a baseplate and the template tool.
Figure 14:
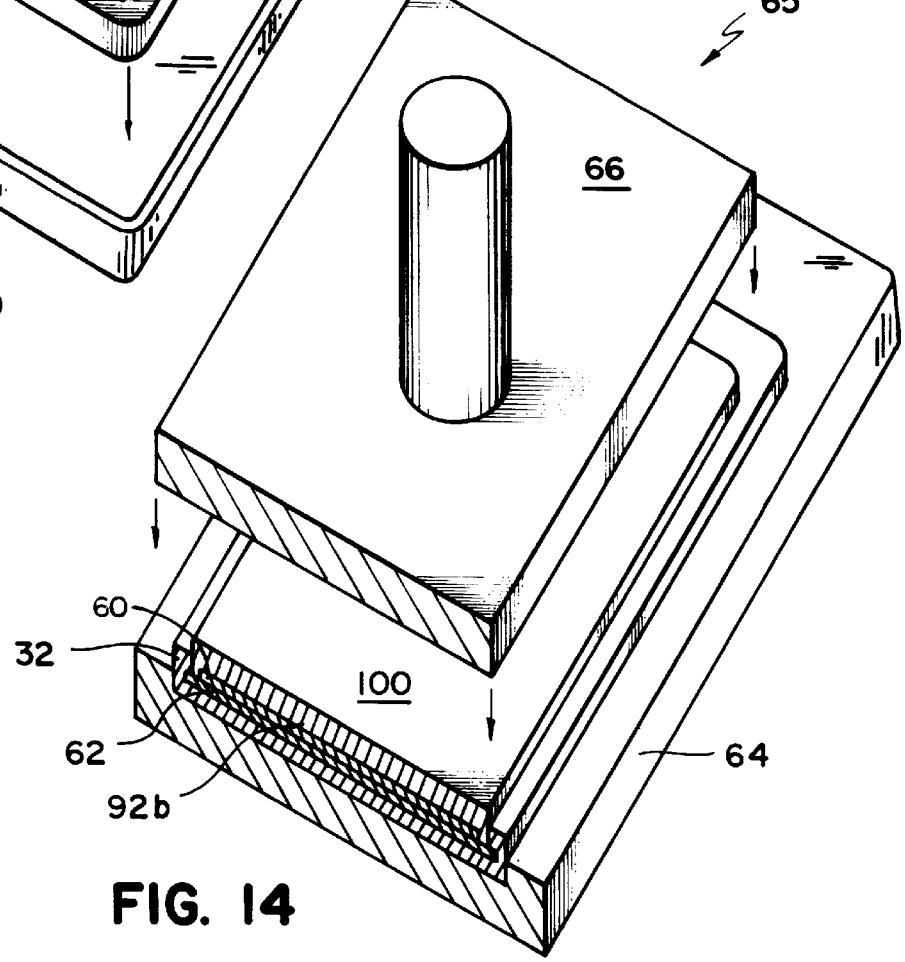
FIG. 14 is a perspective cutaway view of a bonding process.

As shown in FIG. 12, the input and output shields 92*a*, 92*b* are set in recesses 102, 104 of template tool 100. Referring to FIG. 13, in which the bottom of the baseplate 32*a* is showing, baseplate 32 is assembled to template tool 100 such that template tool 100 fits snugly within recess 44 (indicated by dashed lines 114). Referring to FIG. 14, the assembled template tool and baseplate is then put in a press 65 with baseplate 32 resting on heat plate 64.

Figure 15:
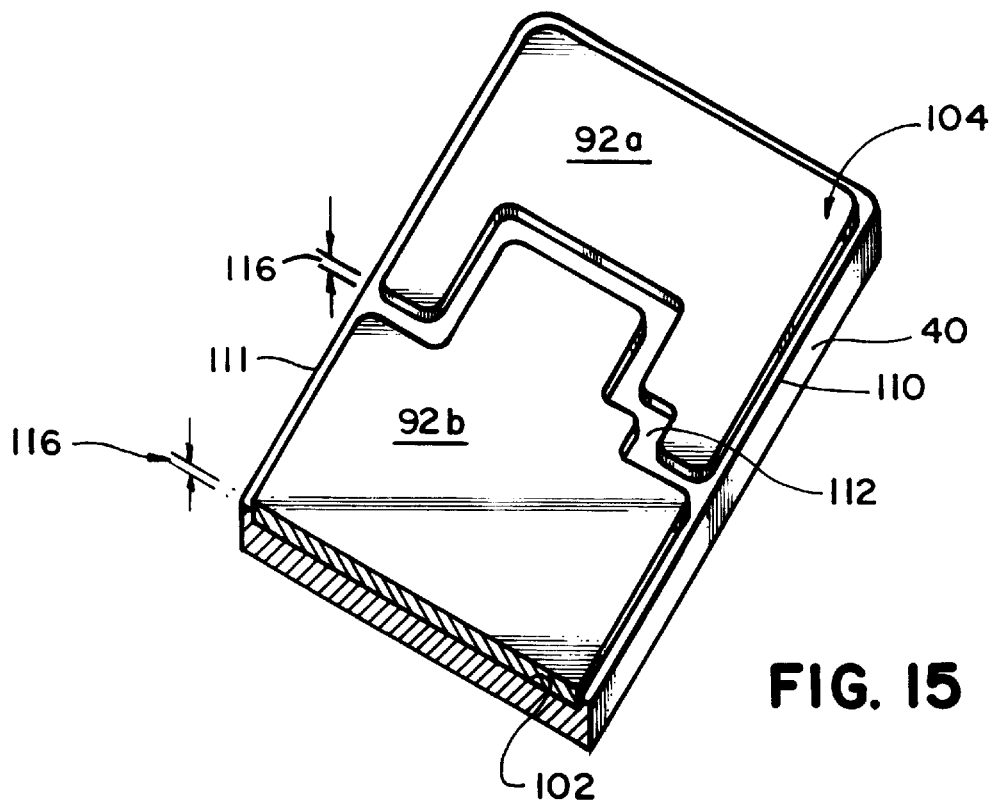
FIG. 15 is another perspective bottom cutaway view of the template tool with shields placed in recesses of the template tool.

As shown in FIG. 15, a portion 116, approximately 0.003 inches, of the thickness of the shields 92*a*, 92*b* extends above recesses 102, 104 in template tool 100. As a result, when press tool 66 is brought down on the assembled template tool and baseplate (FIG. 14), the shields will bond with film layers 60, 62 but the ridges 110, 111, 112 on the tool will not bond with the film layers.

When baseplate 32 is put back in the press 65, the heat plate 64 heats the baseplate to approximately 250° C. The press tool 66 rests, at about zero to twenty psi, on the template tool 100 for about thirty seconds to allow released gases and air to escape, and then the press increases the pressure on the press tool to about 400 psi for another thirty seconds. As a result, the shields are precisely registered within the recess 44 and bonded to film layers 60, 62 in one step. The precision of the registration allows the shields to be as large as possible; the shields are placed as close as possible to the edge 96 of baseplate ridge 46 (i.e., D1 and D2 are minimized, FIG. 10) and as close as possible to each other (i.e., D3 is minimized). Template tool 100 and baseplate 32 are then removed from press 65, the template tool is removed from the baseplate, and the baseplate is allowed to cool.

The bonded film layers 60, 62 (i.e., insulating layer 42, FIG. 2) are only about 0.0026 inches thick each. A burr (i.e., sharp protrusion) on a shield can cause a short circuit between the shield and the baseplate should the press force a burr through the bonded film layers 60, 62. Debris on the film layers pose a similar hazard. Another danger of burrs on a shield is the possibility of forming shorts with the inside edge 96 of ridge 46 or with the other shield (FIG. 10) or of reducing the maximum voltage differential between the baseplate edge 96 and the shields or between the shields themselves. Thus, the film layers must be kept clean, and the shields must be burr free.

There are many known ways of forming the shields, including etching, punching, and laser cutting the shields from a sheet of material. Laser cutting eliminates burrs. Chemical etching is cheaper than laser cutting and is inherently burr free because the liquids used in etching round the edges of the layer being etched. Performing the etching on a surface, or fixture, in which the shields are stored and from which the shields can later be removed just prior to placing them in the recess, will minimize handling and help to maintain the shields in a burr-free state.

Punching the shields from a sheet of shield material is cheaper than etching but punching can result in burrs. Fortunately, punching insures that if there are burrs, they will all go in the same direction. The surface of the shield that is in the direction of the burrs is the surface that is placed within the recesses 102, 104 of template tool 100. The recesses can be milled with reliefs to accommodate the burrs.

Figure 16:
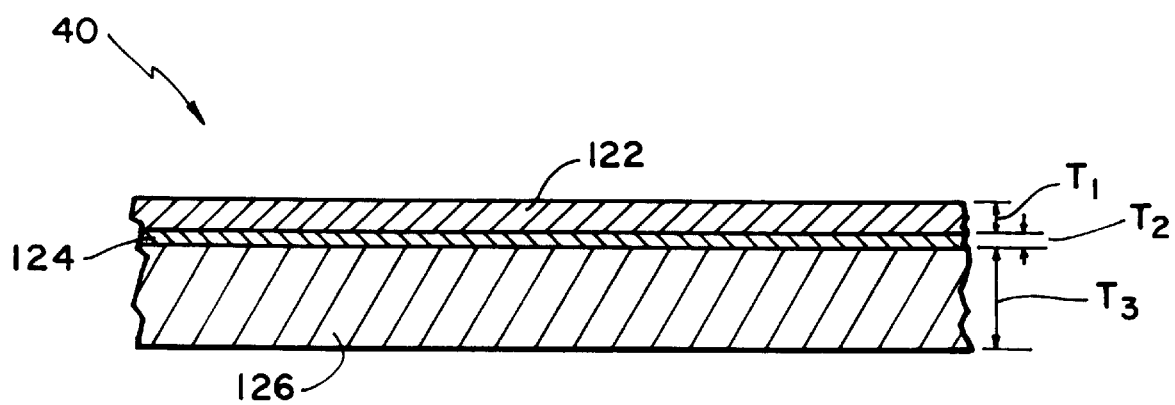
FIG. 16 is a sectional side view of a portion of a shield.

Making the shield out of the same material as the baseplate (e.g., aluminum) will prevent a thermal expansion coefficient mismatch between the shield and the baseplate. The copper layer 34 (FIG. 2), however, cannot be easily soldered to aluminum. Conversely, silver is easily soldered to copper. Other more expensive metals are also easily soldered to copper including precious metals such as gold and platinum. A layer of silver on a layer of aluminum will separate, however, when the copper layer is soldered to the silver layer. Thus, a "tri-clad" laminated shield, shown in FIG. 16, is provided with a layer of aluminum 122, about 0.019 inches thick T1, an interliner layer of copper 124, about 0.001 inches thick T1, and a layer of silver 126, about 0.002 inches thick T3. The thick layer of aluminum insures that the thermal expansion coefficient of the shield close to that of the aluminum baseplate. Copper layer 124 prevents silver layer 126 and aluminum layer 122 from separating when copper layer 34 is soldered to the silver layer. Additionally, shield 40 retains a high thermal conductivity. Other materials, such as nickel, can be used as an interliner to prevent the aluminum and the silver layers from separating but copper is preferred for its high thermal conductivity.

After the input and output shields are bonded to film layer 60, 62 (i.e., insulating layer 42, FIG. 2) within baseplate recess 44, the integrity of the bond can be tested by determining the capacitance between each shield and the baseplate. The surface area of each shield, the thickness of the film layer and the permittivity of the film establish a predetermined capacitance between each shield and the baseplate. The difference between the predetermined capacitance and the measured capacitance indicates the integrity of the bond. Gaps between the baseplate, the insulating film, and the shield reduce the measured capacitance. If the measured capacitance falls below a predetermined threshold, then it can be used as a reliable indicator of a defective assembly.

Figure 17:
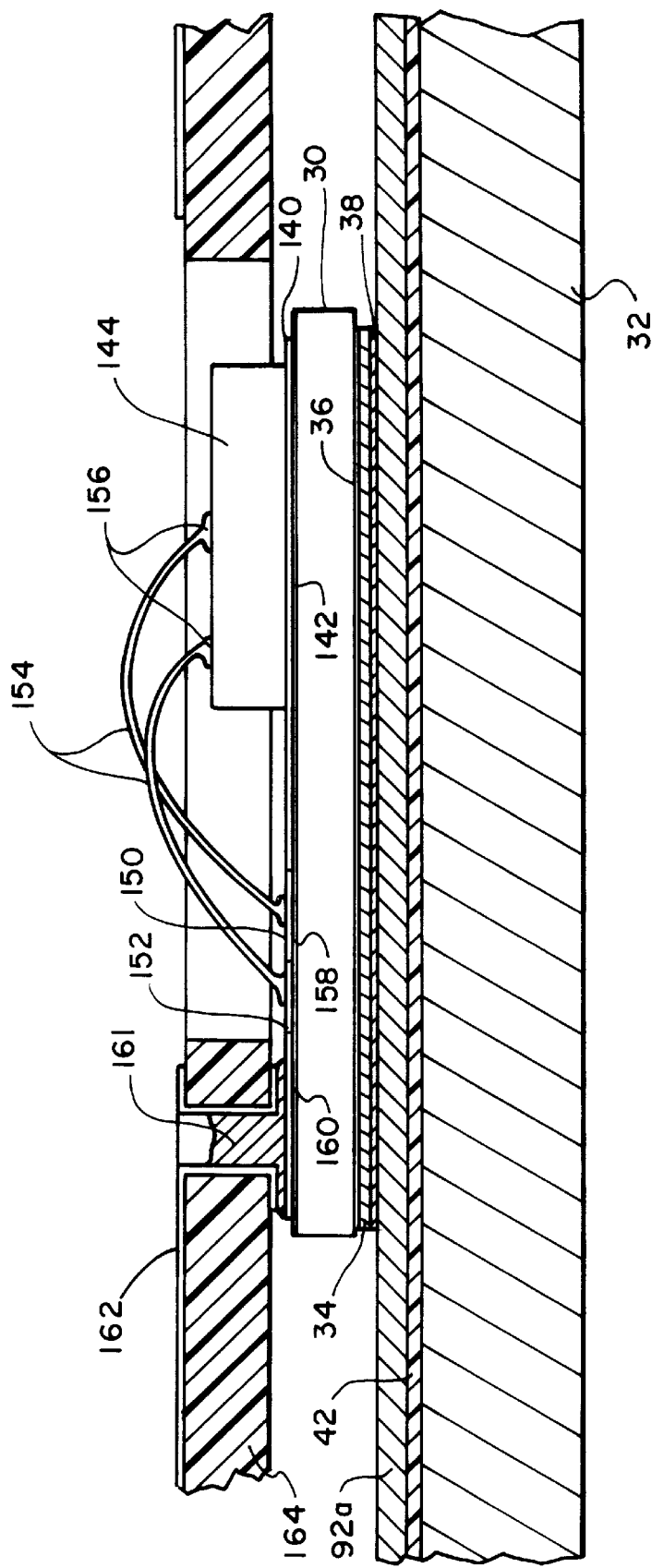
FIGS. 17 and 18 are side and perspective views of an electrical circuit packaging scheme.
Figure 18:
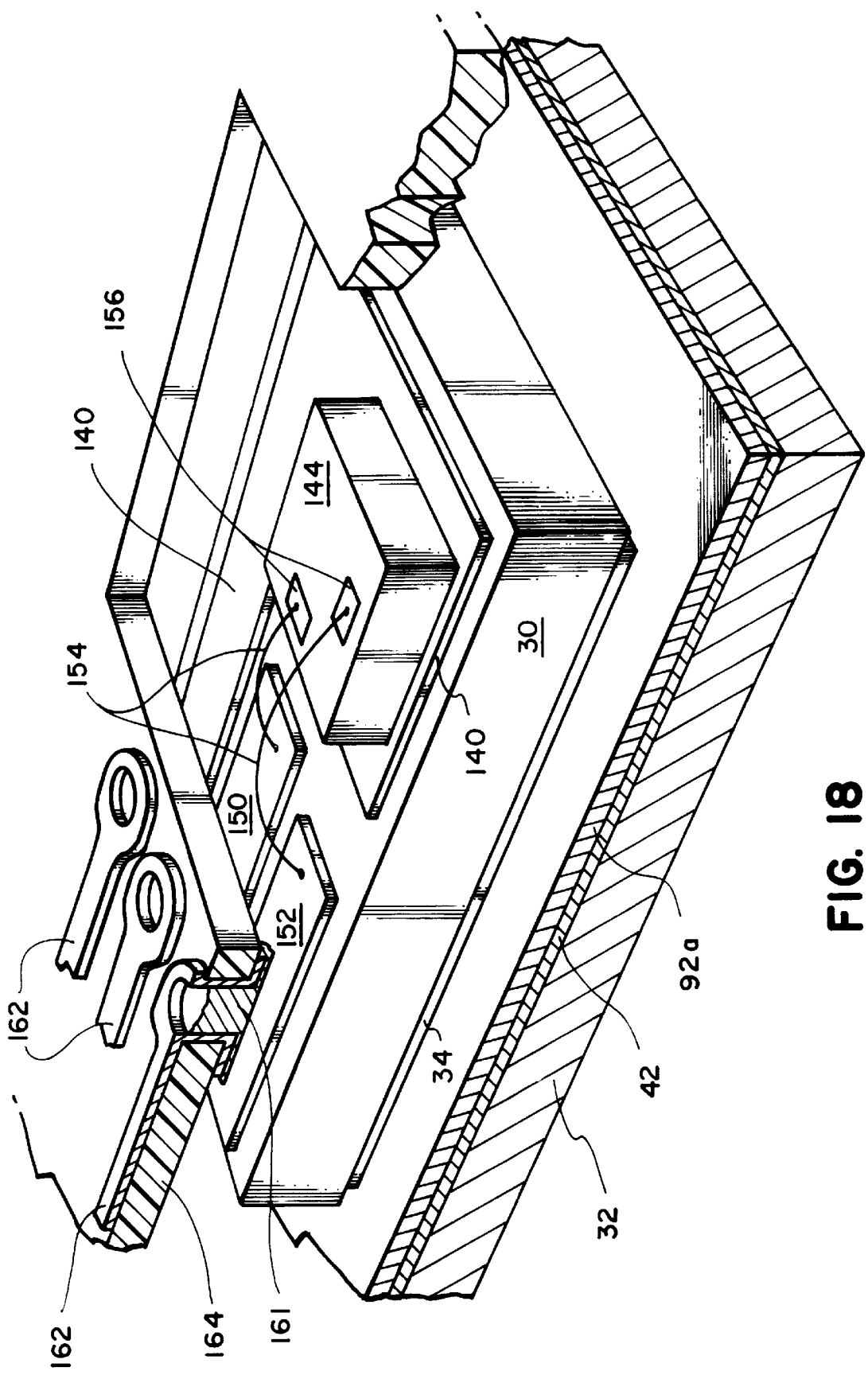

FIGS. 17 and 18 illustrate a typical mounting of a power device to a shield and the connection of the power device to a PCB. As shown, copper layer 34 is directly bonded to ceramic layer 30 through eutectic bond 36. Conductive copper lead 140 is connected through eutectic bond 142 to a top of ceramic layer 30, and a semiconductor die 144 is soldered to a top side of copper lead 140. Two other copper leads 150, 152, which may be electrically connected through wires 154 to conductive pads 156 on a top of die 144, may also be directly bonded through eutectic bonds 158, 160 to ceramic layer 30. Copper leads 140, 150, and 152 can later be soldered 161 to conductive runs 162 on a PCB 164. The combination of die 144, copper leads 140, 150, 152, ceramic layer 30, and copper layer 34 will be referred to as an integrated power device (IPD).

Figure 1B:
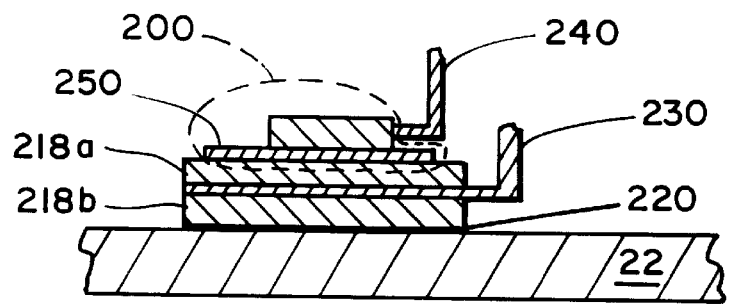
FIG. 1b is a cross-sectional side view of another electrical circuit packaging scheme.

As previously mentioned, a shield 92 (FIG. 17) can be connected to act as an electrostatic shield (e.g. in FIGS. 17 and 18, between the leads 140, 150, 152 and the baseplate 32, FIG. 18; between etches 162 on the PCB and the baseplate 32) in a manner similar to that described with respect to FIG. 1*b*. The shield can also be used to carry current between different points within the assembly. In order to do this, conductive shunts are formed in locations where connections, typically, between the PCB and the shield, will be located.

Figure 19:
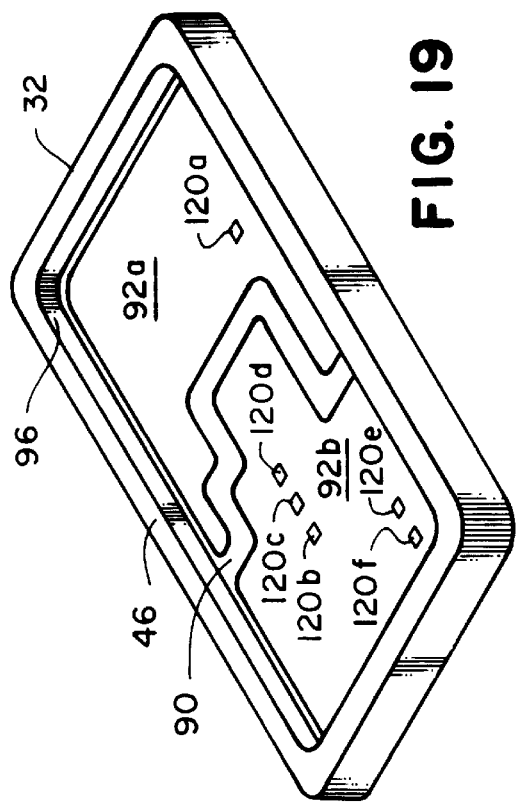
FIG. 19 is a perspective view showing shunts.
Figure 20A:
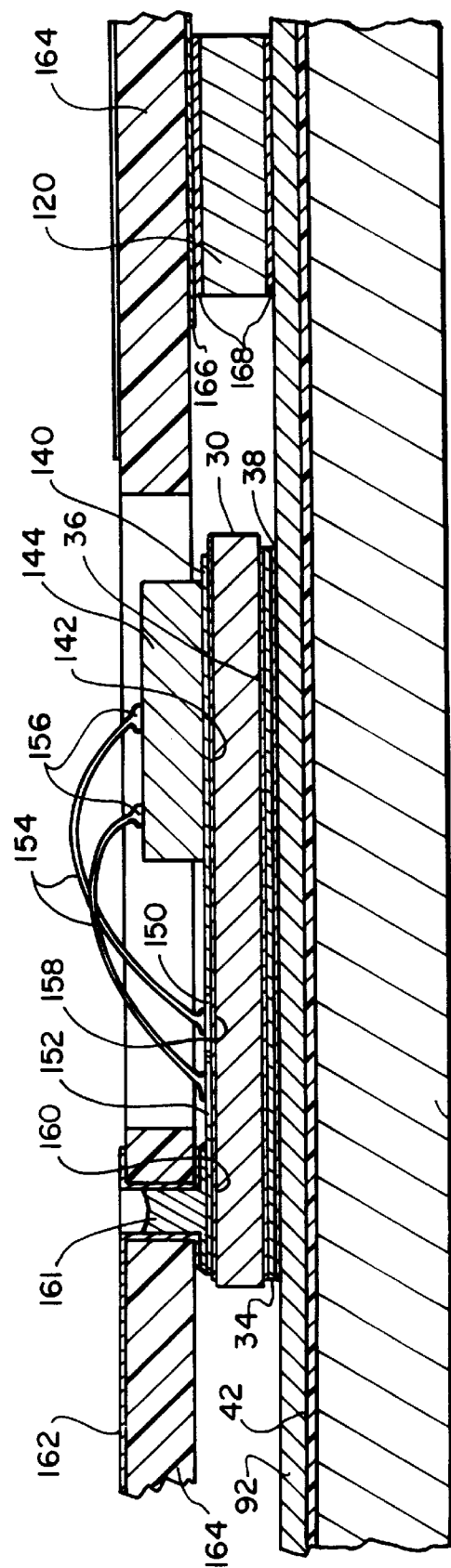
FIGS. 20a and 20b are side and perspective sectional views of an electrical circuit packaging scheme with a shunt.

Referring to FIG. 19, a shield assembly for a power converter device is marked with locations for several shunts: one shunt location 120a on input shield 92a and several shunt locations 120b, 120c, 120d, 120e, 120f on output shield 92b. In FIG. 20a, a conductive shunt 120 is shown installed between a shield 92 and an etch 166 on a PCB 164. Solder 168 connects the shunt 120 to the shield 92 and to the etch 166.

Figure 20B:
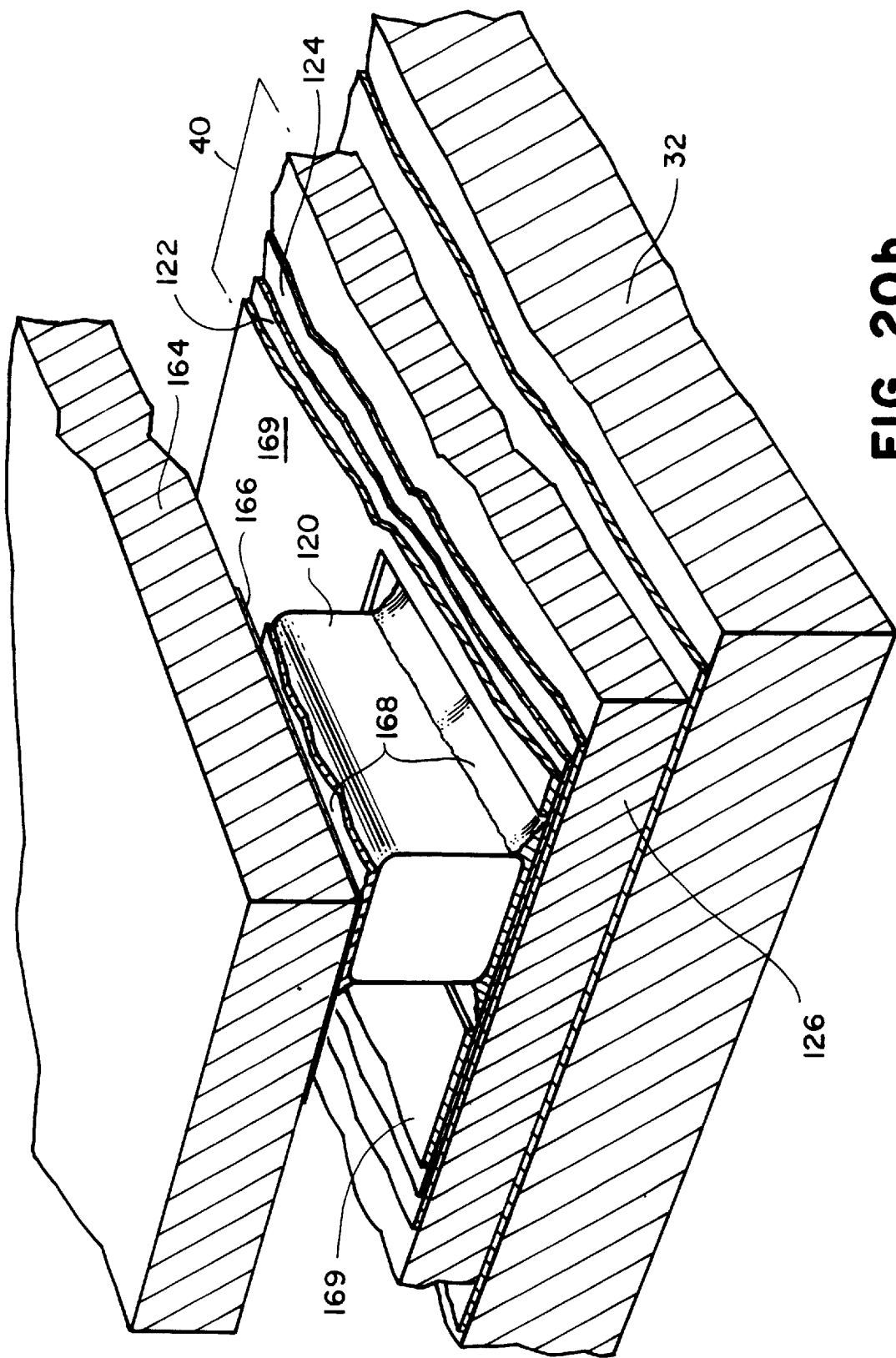

In FIG. 20b a conductive shunt 120 is installed between a laminated tri-clad shield 40 (of the kind shown in FIG. 19, having three metallic layers 122, 124, 126) and an etch 166 on a PCB 164. Solder 168 connects the top and bottom of the shunt 120 to the shield 92 and the etch 166. During installation, a predetermined quantity of solder paste is placed on the top surface of the shield in the location at which the shunt 120 is to be mounted. The shunt is then placed onto the solder paste. The solder is reflowed by heating the baseplate. In certain applications it is useful to put a solder mask 169 (FIG. 20b) on the shield. The mask acts as a "corral" to keep molten solder from flowing outside of the region defined by the mask. This, in turn, will prevent the shunt from rotating, or otherwise moving beyond the region of the corral, during the reflow process, and will also act to keep all of the solder within the vicinity of the shunt 120.

Figure 20C:
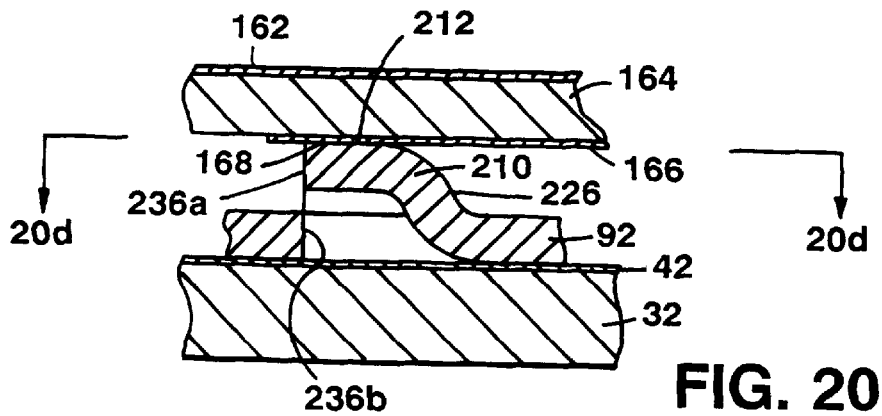
FIGS. 20c and 20f are side cross-sectional views of an electrical circuit packaging scheme with a punt.
Figure 20D:
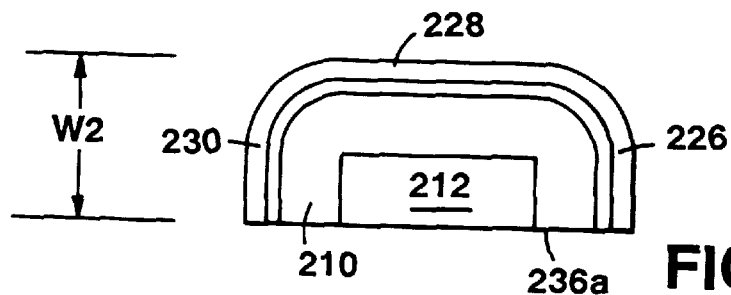
FIGS. 20d and 20g are top views of the punts of FIGS. 20c and 20f, respectively.

Alternatively, shunt 120 is replaced by punt 210 (FIGS. 20c and 20d). Punt 210 is a shunt that is punched into shield 92. The top surface 212 of punt 210 is soldered 168 to etch 166 on PCB 164 to provide an electrical connection between the shield and the PCB. Using a punt instead of a shunt reduces inventory and eliminates the process step of positioning and soldering a shunt to the shield.

Referring to FIG. 20e, to form punt 210, shield 92 is laid over a die 214 having an indentation 216. A punch 218, which is aligned with the indentation, is then pressed down (arrows 219) against the shield. Rounded surface 222 of die 214 and rounded surface 224 of punch 218 stretch or draw the shield into the die to form the rounded portions 226, 228, and 230 (FIG. 20d) of punt 210. Edge 232 of die 214 and edge 234 of punch 218 are sharp (i.e., not rounded) and shear shield 92 along edges 236a and 236b to provide punt 210 with a "louver" configuration.

Figure 20F:
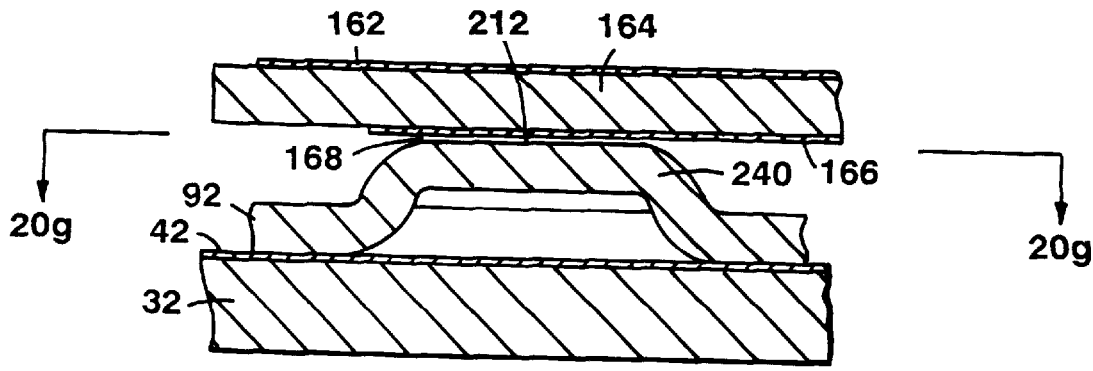
Figure 20G:
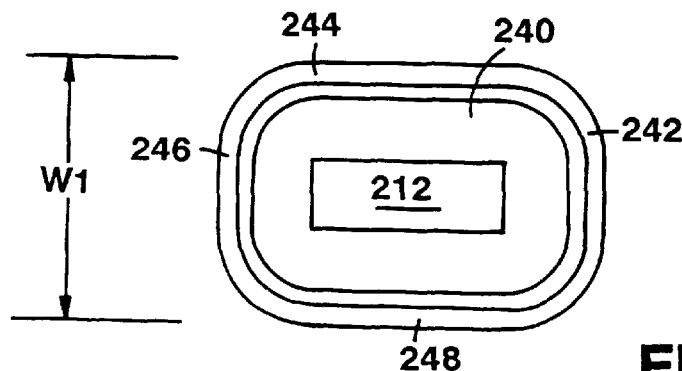

Instead of a louver type punt, a fully-rounded punt 240 (FIGS. 20f and 20g) may be provided by drawing the punt on all sides 242, 244, 246, and 248. The degree (i.e., steepness) of the curvature of the sides of a punt is limited by the shield's temper (i.e., hardness) and, in the case of a clad material (i.e., multi-layer), by the strength of the bonds between the layers. A fully-rounded punt generally requires more shield real estate than a louver punt (i.e., w1, FIG. 20g, is larger than w2, FIG. 20d) because a louver punt is drawn on only three sides. Positioning a fully-rounded punt near an edge 250 (FIG. 19) of the shield may cause the edge to ripple or deform as the shield is drawn (i.e., stretched) to form the punt. However, positioning the sheared edge 236b of the louvered punt near an edge (e.g., edge 250, FIG. 19) of shield 92 prevents the edge from rippling because the shield is not drawn along sheared edge 236b.

The shunt 120 or punt 210 can be used functionally to make a reference connection between the shield and circuitry on the PCB so that the shield performs as an electrostatic shield. The shunt or punt may also be used to carry current from circuitry on the PCB into the shield as a means of delivering current to other areas on the PCB (via another shunt or punt located elsewhere on the shield (not shown) or to deliver current from the PCB to output termination leads.

Because a fully-rounded punt is connected on all sides to the remaining portions of the shield, the fully-rounded punt may be capable of passing larger electrical currents than the louvered punt. The cross-sectional area (i.e., thickness times width) which can be made available in the shields, by making the shields thick and wide, makes them ideal for carrying large amounts of current.

A benefit of using the shunt or punt to make connections between the PCB and the shield (as opposed, for example, to using tabs punched to form right angle connections to the shield) is that a single shunt embodiment (for example, copper wire) or punt, 0.030 inches in diameter and 0.1 inches in length, can be used for a wide variety of products, or product variations. Different levels of current can be accommodated by simply adding more shunts or punts. For example, a low current power converter (e.g., a 50 Watt converter delivering an output of 1 Ampere at 50 Volts) might use a single shunt or punt to carry current to its output terminations via the shield, whereas a high current converter (e.g., a 50 Watt converter delivering an output of 10 Amperes at 5 Volts) might use three shunts or punts to carry current to its output terminations via the shield. Both a common shield arrangement and PCB could be used for both models of power converter: for the low current model a single shunt (e.g. shunt 120d, FIG. 19) or punt (e.g., punt 210, FIG. 20c) would be installed on the shield; for the high current model three shunts (120b, 120c, 120d) or punts (not shown) would be installed.

Referring to FIG. 25, an automated production line 270 is used to mount shields (not shown) in baseplates 272 (electrical insulators, not shown, having been previously installed in the baseplates). A conveyor belt 274 carries baseplates 272 first to a shield station 276. Within shield station 276, shields, corresponding to the particular baseplates passing through the shield station, are selected from a shield supply 278 and mounted within the baseplates. The conveyor belt then carries the baseplate and shield assemblies 279 to a PCB station 280 where PCBs (not shown), corresponding to the particular baseplate and shield assemblies passing through the PCB station, are selected and mounted to the baseplates.

Where shunts (not shown) are used to provide electrical connections between the shields and the PCBs, the automated production line further includes a shunt station 282. At shunt station 282 a number of shunts are selected from a shunt supply 284 and soldered to the shields. Both the number of shunts and the configuration of the soldered shunts corresponds to the particular baseplate and shield assemblies passing through the shunt station.

Where punts (not shown) are used to provide electrical connections between the shields and the PCBs, the shield station selects shields from the shield supply having a number and configuration of punts that corresponds to the particular baseplates passing through the shield station. Alternatively, shield station 276 selects shields from the shield supply and forms (e.g., punches) the predetermined number and configuration of punts into each selected shield. The shield station may punch all rounded type punts, all louvered type punts, or a combination of louvered and rounded punts. A large die including the entire pattern of punts may be used to punch all the punts simultaneously or the shield may be moved over a smaller die to individually punch each punt.

Because the shields have been precisely registered within the baseplate recess, the edges of the baseplate and notch 94 (FIG. 10) can be used by a robotic mechanism as references to precisely place the IPD on, for example, input shield 92a. Until the IPD is finished being soldered in place, however, it is capable of shifting, either during soldering or during movement or handling, and this would cause the alignment of the IPD with the PCB to be lost.

Figure 21:
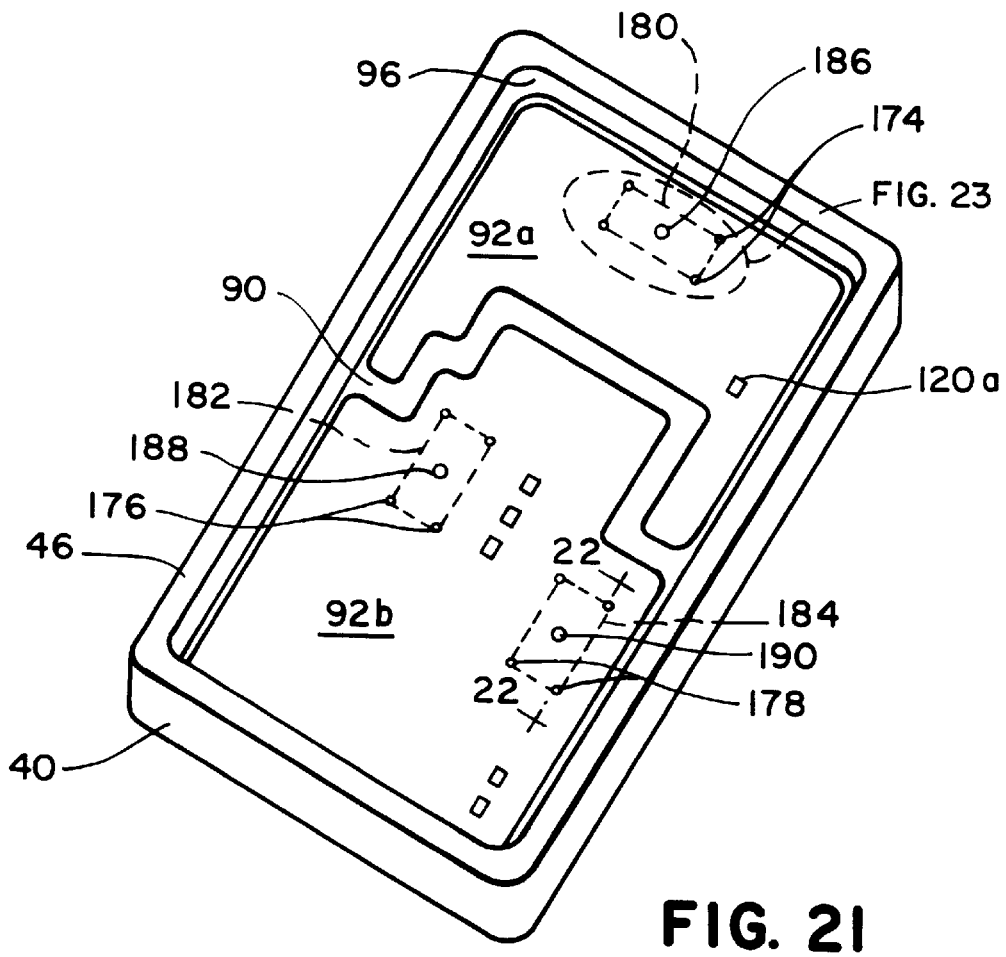
FIGS. 21 and 22 are perspective and cross-sectional views showing epoxy dots and flux dots.
Figure 22:
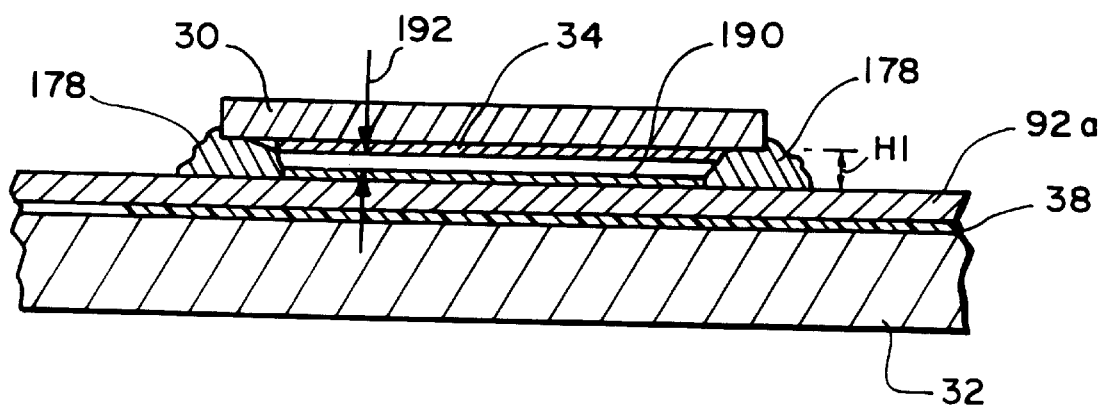

Referring to FIG. 21, in order to prevent the IPD from moving until it is soldered in place, an epoxy dispenser (not shown) places dots of epoxy 174, 176, 178 at locations along the perimeter of three locations (indicated by dashed lines 180, 182, 184) where three IPDs are to be placed. For a rectangular IPD, for example, one epoxy dot can be placed in each of the four corners of the placement location. IPDs may be formed in many shapes, and the placement of epoxy dots will vary depending upon those shapes. A dot of flux 186, 188, 190 is also placed at the center of locations 180, 182, 184. Referring also to FIG. 22, the epoxy dots hold the IPD precisely where it is placed on the surface of the shield 92a and also provide a gap 192, between the copper layer 34 and the surface of the shield 92a, into which solder can be reflowed.

Too large a gap 192 results in solder voids and increased thermal resistance. A gap 192 that is too small, however, will not allow the solder to form a good connection between copper layer 34 and shield 92a. The actual height of the gap will be a function of the viscosity of the epoxy, the force applied in placing the IPD, and other factors, including size of particulate matter or fillers in the epoxy. A gap of about 0.001 inches is preferred but a gap of between 0.001–0.003 inches is acceptable.

Figure 1C:
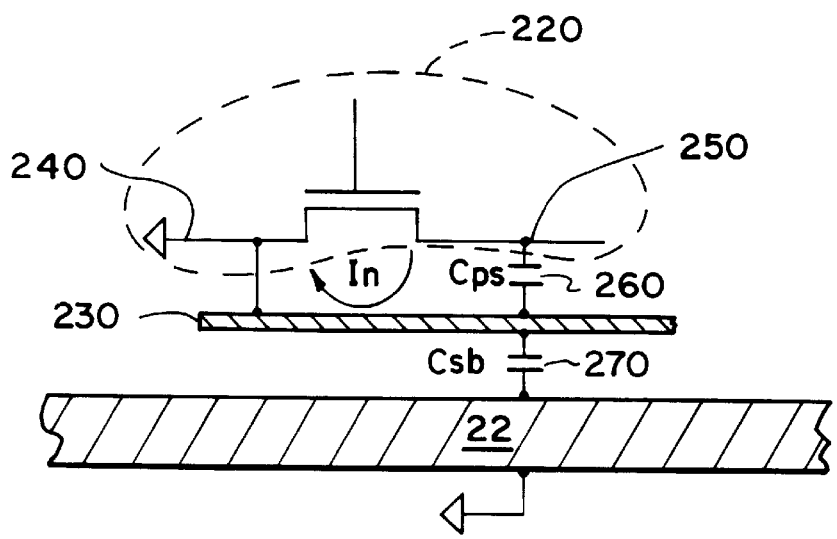
FIG. 1c is a schematic cross-sectional side view of the packaging scheme of FIG. 1b.

If epoxy were to be used to mount the IPD to the shield (or directly to the baseplate, as in FIG. 1a) a 3:1 range of variation of epoxy thickness would almost certainly be unacceptable, since the poor thermal conductivity of epoxy makes it a major determinant in the overall thermal resistance between the die (10, FIG. 1 a) and the baseplate (22, FIG. 1a). Where solder is used for mounting the IPD, however, the very high thermal conductivity of the solder makes the overall effect of the gap width (192, FIG. 22) on thermal conductivity almost negligible relative to other factors (e.g., the thickness of the ceramic 30).

In order for the epoxy dots to hold the IPD until the dots are cured (i.e., hardened by baking the baseplate assembly in an oven), the epoxy needs several characteristics. First, the epoxy needs to be thixotropic (i.e., highly viscous) with a sufficient "green strength" (i.e., ability to stick to something in the uncured state) to hold the IPD in place while the assembly is moved during the steps of assembly. Because the dots are at the perimeter of the IPD, the dots need to stick to portions of the exposed ceramic layer 30 surrounding the bottom copper layer 34 (FIG. 20) and may also stick to portions of copper layer 34. If ceramic layer 30 is not exposed around copper layer 34, then the epoxy dots need to stick to copper layer 34. A dot height, at time of dispensing, of about 0.010 to 0.030 inches is preferred. The placement of the IPD will displace a portion of each epoxy dot. Each dot will have some bounce back, and the resultant dot height H1 (FIG. 21) needs to be larger than the thickness of the bottom copper layer 34 (i.e., 0.005 inches).

Second, the epoxy needs to have a low modulus (i.e., needs to be highly elastic) to compensate for the thermal expansion coefficient mismatch between the ceramic layer 30 and input shield 92a. Lastly, the green strength of the epoxy cannot be reduced by the flux dots. The flux is not thixotropic, and, thus, when flux dot 190 is placed in the center of location 184 it spreads out (FIG. 22) and may come in contact with epoxy dots 178. If the epoxy is not resistant to the flux, the epoxy will not hold the IPD in place. An epoxy such as 933-1 sold by Ablestik Labs works well.

Figure 23:
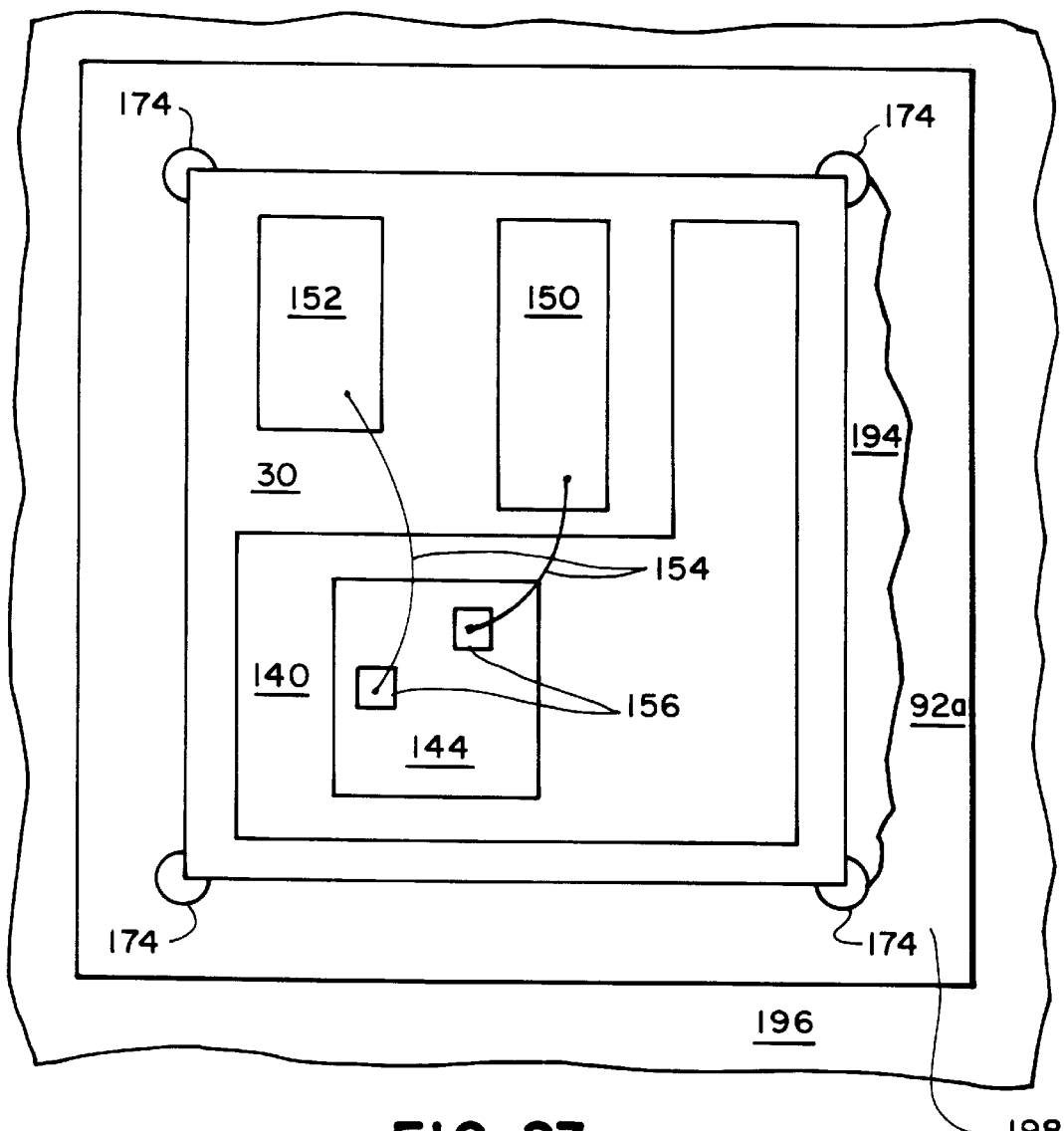
FIG. 23 is a plan showing epoxy dots and a corral.

As shown in FIG. 23, a solder mask 196 may be located on the shields during shield manufacture. Solder mask 196 surrounds the location of the IPD while leaving an unmasked area 198 (i.e., a "corral") directly adjacent to the IPD. The corral helps to ensure that solder fills the region underneath the IPD by keeping the molten solder within the region of the corral and preventing molten solder from flowing away from the IPD over the surface of the shield.

After the IPD is placed on the epoxy dots, the baseplate assembly is placed in an oven and the epoxy dots are cured. Referring to FIG. 23, solder paste 194 is then dispensed along one or more sides of the IPD. The baseplate is then heated causing the solder to reflow by capillary action into gap 192 (FIG. 22). A high temperature solder, such as SN96 (i.e., $96^{1}/_{2}\%$ tin, $37^{1}/_{2}\%$ silver), is preferred for its reflow characteristics, and with such a solder, the baseplate is heated to about 221° C.

Figure 24:
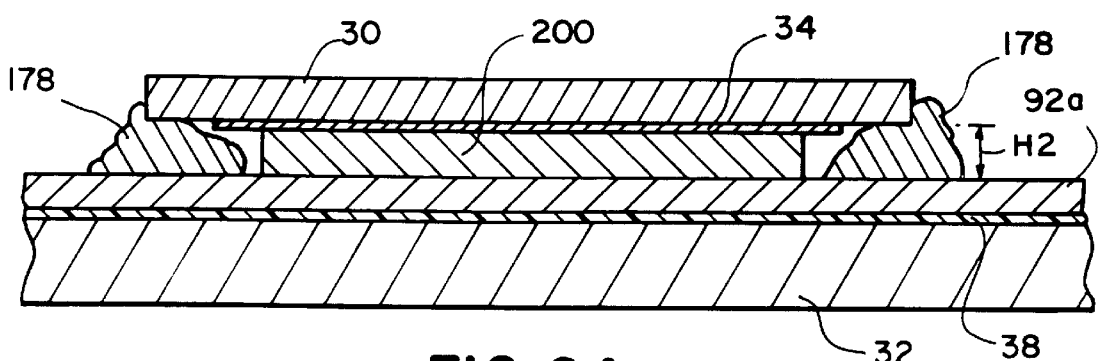
FIG. 24 is a cross-sectional view showing epoxy dots and a solder preform.

An alternative to the solder paste is a solder preform. A solder preform is punched to correspond to the shape of the IPD from a thin sheet of rolled solder. The epoxy dots are dispensed onto the shield, as previously described. The dot of flux may also be dispensed or the solder preform can be purchased with a flux coating. Referring to FIG. 24, the preform 200 is placed on the shield in between the pattern of epoxy dots 178. The IPD is then placed over the preform, the epoxy is cured, and the baseplate is heated to cause the solder preform to reflow and form a solder bond between copper layer 34 and shield 92a (or 92b).

A benefit of using a solder preform is that the height H2 of the gap between the shield and the bottom copper layer of the IPD is accurately set to equal the thickness of the preform. However, solder preforms are flimsy, difficult to handle, and difficult to accurately place. Further, each different IPD will require a preform of a different shape. Consequently, while a single solder paste dispensing system can be used under software control to manufacture many different products and product variations, manufacturing a similar range of products using solder preforms is made more complex by the need to purchase, inventory, handle and place a wide variety of preforms on the manufacturing line.

Other embodiments are within the following claims.

What is claimed is:

1. A method of manufacturing packages for electrical circuits moving along an automated production line, comprising providing a supply of conductive shunts at a station along the production line, and for each of the packages that approach the station on the production line:

determining the shunts required to be soldered between a shield and a substrate of the package, and soldering the required shunts to the shield.

2. The method of claim 1, wherein the conductive shunts are identical.

3. The method of claim 1, wherein the shield includes segments.

4. The method of claim 3, wherein the shield segments include an input shield segment and an output shield segment, and determining includes determining the shunts required to be soldered between the input shield segment and the substrate and between the output shield segment and the substrate, and soldering includes soldering the required shunts to the input shield segment and the required shunts to the output shield segment.

5. A method of manufacturing packages for electrical circuits moving along an automated production line, comprising provintiding a supply of metallic shields at a station along the production line, the shields including a different number of punts, and for each of the packages that approach the station on the production line:
determining the punts required to be soldered to a substrate of the package,
selecting a shield with the determined number of punts, and
soldering the punts of the selected shield to the substrate.

6. The method of claim 5, wherein the conductive punts are identical.

7. The method of claim 5, wherein the shield includes segments.

8. The method of claim 7, wherein the shield segments include an input shield segment and an output shield segment, and determining includes determining the punts required to be soldered between the input shield segment and the substrate and between the output shield segment and the substrate.

9. A method of manufacturing packages for electrical circuits moving along an automated production line, comprising providing a supply of metallic shields at a station along the production line, and for each of the packages that approach the station on the production line:
determining the punts required to be soldered to a substrate of the package,
punching a shield with the determined number of punts, and
soldering the punts of the punched shield to the substrate.

10. The method of claim 9, wherein the conductive punts are identical.

11. The method of claim 9, wherein the shield includes segments.

12. The method of claim 11, wherein the shield segments include an input shield segment and an output shield segment, and determining includes determining the punts required to be soldered between the input shield segment and the substrate and between the output shield segment and the substrate.

* * * * *

UNITED STATES PATENT AND TRADEMARK OFFICE
CERTIFICATE OF CORRECTION

PATENT NO. : 6,119,923
DATED : September 19, 2000
INVENTOR(S) : Patrizio Vinciarelli et al.

It is certified that error appears in the above-identified patent and that said Letters Patent is hereby corrected as shown below:

<u>Title page,</u>
Item [57], ABSTRACT,
Line 26, insert a period after "conductor".

<u>Column 2,</u>
Line 50, change "includes" to -- include --.

<u>Column 3,</u>
Line 66, after "shield" insert -- segment --.

<u>Column 10,</u>
Line 21, after "shield" insert -- remains --.

Signed and Sealed this

First Day of April, 2003

JAMES E. ROGAN
*Director of the United States Patent and Trademark Office*